US012757329B2

(12) United States Patent
Iida et al.

(10) Patent No.: US 12,757,329 B2
(45) Date of Patent: Oct. 6, 2026

(54) MULTILAYER SUBSTRATE, METHOD FOR MANUFACTURING MULTILAYER SUBSTRATE, AND ELECTRONIC DEVICE

(71) Applicant: FICT LIMITED, Nagano (JP)

(72) Inventors: Kenji Iida, Nagano (JP); Taiji Sakai, Nagano (JP); Takayuki Inaba, Nagano (JP); Takashi Nakagawa, Nagano (JP)

(73) Assignee: FICT LIMITED, Nagano (JP)

( * ) Notice: Subject to any disclaimer, the term of this patent is extended or adjusted under 35 U.S.C. 154(b) by 246 days.

(21) Appl. No.: 18/845,641

(22) PCT Filed: Dec. 9, 2022

(86) PCT No.: PCT/JP2022/045405
§ 371 (c)(1),
(2) Date: Sep. 10, 2024

(87) PCT Pub. No.: WO2023/176063
PCT Pub. Date: Sep. 21, 2023

(65) Prior Publication Data

US 2025/0194009 A1 Jun. 12, 2025

(30) Foreign Application Priority Data

Mar. 16, 2022 (JP) ................................ 2022-041827

(51) Int. Cl.
*H05K 1/11* (2006.01)
*H05K 1/02* (2006.01)
(Continued)

(52) U.S. Cl.
CPC ........... *H05K 1/115* (2013.01); *H05K 1/0206* (2013.01); *H05K 1/181* (2013.01); *H05K 3/4038* (2013.01)

(58) Field of Classification Search
CPC .... H05K 1/115; H05K 1/0206; H05K 3/4038; H05K 3/42
See application file for complete search history.

(56) References Cited

U.S. PATENT DOCUMENTS

2007/0289128 A1 12/2007 Takano et al.
2014/0231126 A1* 8/2014 Hunrath .............. H05K 3/4069 174/264
2022/0061158 A1 2/2022 Jung

FOREIGN PATENT DOCUMENTS

JP 2004-158671 A 6/2004
JP 2006-332449 A 12/2006
(Continued)

OTHER PUBLICATIONS

International Search Report dated Feb. 28, 2023, issued in counterpart International Application No. PCT/JP2022/045405. (2 pages).
(Continued)

*Primary Examiner* — Sherman Ng
(74) *Attorney, Agent, or Firm* — WHDA, LLP

(57) ABSTRACT

To shorten a manufacturing process and to decrease an interlayer resistance value to thereby increase an allowable current value are set as problems. As means for solving the problems, in a multilayer substrate (20) which includes a plurality of insulating layers (24) and a plurality of metal layers (12) formed on both surfaces of the insulating layers (24) and patterned, and in which the metal layers (12), (12) are interlayer-coupled to each other with vias, there are included layers which are interlayer-coupled to each other with plated vias (14), and layers which are interlayer-coupled to each other with paste vias (16) filled with a conductive paste.

11 Claims, 47 Drawing Sheets

(51) Int. Cl.
*H05K 1/181* (2026.01)
*H05K 3/40* (2006.01)

(56) References Cited

FOREIGN PATENT DOCUMENTS

| | | | |
|---|---|---|---|
| JP | 2007-335631 | A | 12/2007 |
| JP | 2007-335698 | A | 12/2007 |
| JP | 2013-55123 | A | 3/2013 |
| JP | 2013-258345 | A | 12/2013 |
| JP | 2015-130398 | A | 7/2015 |
| JP | 6291738 | B2 | 3/2018 |
| JP | 2019-102790 | A | 6/2019 |
| TW | 200731900 | A | 8/2007 |
| TW | 201136463 | A | 10/2011 |

OTHER PUBLICATIONS

Office Action dated Mar. 24, 2026, issued in counterpart TW Application No. 111148267, with English translation. (10 pages).

* cited by examiner

MULTILAYER SUBSTRATE, METHOD FOR MANUFACTURING MULTILAYER SUBSTRATE, AND ELECTRONIC DEVICE

TECHNICAL FIELD

The present invention relates to a multilayer substrate, a method for manufacturing a multilayer substrate, and an electronic device using a multilayer substrate.

BACKGROUND ART

In the past, in order to compactly incorporate electronic components into an electronic device, circuit boards such as printed-wiring boards have widely been used. The printed-wiring board is what is obtained by etching a copper foil attached to a laminated board, in accordance with an electronic circuit pattern, and is difficult to densely mount the electronic components, but is advantageous in terms of cost.

Meanwhile, in accordance with requirements such as a reduction in size, an increase in performance, and a reduction in price to the electronic device, miniaturization of an electronic circuit of a circuit board, an enhancement of multilayer, and an enhancement of high-density packaging of electronic components have rapidly advanced, and studies on the multilayer substrate have been activated.

Therefore, as in PTL 1 (JP-A-2004-158671), as the multilayer substrate, there is proposed a buildup multilayer substrate formed by stacking substrate layers made of an insulating material on which conductor patterns are formed, on both surfaces of a core member forming a base in an order in which the conductor patterns are formed.

Further, in PTL 2 (JP-B-6291738), as a multilayer substrate which is short in manufacturing process, and uniform thickness of which can be obtained, there is disclosed a configuration which has a plurality of plate like structures in which a first metal layer shaped like a pattern is disposed on one surface of an insulating material, and a hole which reaches the first metal layer from the other surface of the insulating material is filled with a conductive paste, and the plate like structure filled with the conductive paste and another plate like structure filled with another conductive paste are stacked so that the first metal layer of the plate like structure and an opening part of the hole of the other plate like structure correspond to each other.

CITATION LIST

Patent Literature

PTL 1: JP-A-2004-158671
PTL 2: JP-B-6291738

SUMMARY OF INVENTION

Technical Problem

Such a buildup type multilayer substrate as in PTL 1 described above has a problem that an extremely long time is required for the manufacturing process, and regarding the yield ratio, the yield ratio per layer is reflected in the overall yield ratio as a multiplier of the number of layers when the multilayer is achieved, which makes the manufacturing cost high.

Further, in the circuit board in PTL 2, the interlayer coupling is achieved with the conductive paste, and there is a problem that it is desired to decrease the interlayer resistance value to increase the allowable current value.

Solution to Problem

Therefore, the present invention is made to solve the problem described above, and an object thereof is to provide a multilayer substrate which is short in manufacturing process, and in which the interlayer resistance value is decreased to thereby increase the allowable current value, a method for manufacturing the multilayer substrate, and an electronic device.

According to the multilayer substrate related to the invention, in a multilayer substrate including a plurality of insulating layers, and a plurality of metal layers which are formed on both surfaces of each of the insulating layers, and which are patterned, interlayer coupling between the metal layers is achieved with a via, the multilayer substrate is characterized by including a layer interlayer-coupled with a plated via, and a layer interlayer-coupled with a paste via filled with a conductive paste.

By adopting this configuration, since the interlayer coupling with the plated via is included in addition to the interlayer coupling with the conductive paste, it is possible to decrease the interlayer resistance value to thereby increase the allowable current value.

Further, it can be characterized in that the paste via filled with the conductive paste is not formed in a row in a lamination direction.

Further, it can also be characterized in that an insulating bonding layer is disposed between two insulating layers having contact with the metal layer electrically coupled with the paste via, and two insulating layers having contact with the metal layer electrically coupled with the plated via are directly laminated without an insulating bonding layer disposed between the two insulating layers.

Since it is possible not to dispose the bonding layer in all of the layers but to reduce the bonding layer, it is possible to enjoy an advantage in terms of manufacturing cost.

Further, it can also be characterized in that a plurality of plated-via laminated bodies having a plurality of insulating layers the metal layers of which are interlayer-coupled with the plated via is provided, and the plurality of plated-via laminated bodies is laminated by being electrically coupled with the paste via filled with the conductive paste.

Further, it can also be characterized in that in some of places where the interlayer-coupling with the plated via is performed in the plated-via laminated body, the metal layers opposed to each other of the plurality of plated-via laminated bodies are not electrically coupled to each other with the paste via, but are configured as a thermal via.

According to the method for manufacturing the multilayer substrate related to the invention, the method is characterized by including a step of manufacturing a plated-via laminated body having a plurality of insulating layers, and a plurality of metal layers which are formed on both surfaces of each of the insulating layers, and which are patterned, and configured by interlayer-coupling the metal layers with a plated via, and a step of electrically coupling the metal layers opposed to each other with a paste via filled with a conductive paste to laminate the plurality of the plated-via laminated bodies.

According to this method, since it is not required to form layer by layer in the manufacture of the multilayer substrate, it is possible to achieve shortening of the manufacturing process. Further, since the interlayer coupling with the plated via is included in addition to the interlayer coupling with the conductive paste, it is possible to decrease the interlayer resistance value to thereby increase the allowable current value.

Further, it can be characterized in that a metal layer which is patterned is not formed on an obverse surface of the plated-via laminated body in an obverse layer located at an obverse surface side of the multilayer substrate and on a reverse surface of the plated-via laminated body in a reverse layer located at a reverse surface side of the multilayer substrate before laminating the plurality of the plated-via laminated bodies, and after laminating the plurality of the plated-via laminated bodies, a step of forming an obverse surface through hole in an insulating layer in an uppermost part of the plated-via laminated body in the obverse layer up to an obverse surface of the metal layer located on a lower surface of the insulating layer in the uppermost part, a step of forming a reverse surface through hole in an insulating layer in a lowermost part of the plated-via laminated body in the reverse layer up to a reverse surface of the metal layer located on an upper surface of the insulating layer in the lowermost part, a step of forming an obverse surface plating pattern on an obverse surface of the insulating layer in the uppermost part including an inside of the obverse surface through hole to thereby couple the obverse surface plating pattern and the metal layer located on the lower surface of the insulating layer in the uppermost part with a plated via obtained by plating the obverse surface through hole, and a step of forming a reverse surface plating pattern on a reverse surface of the insulating layer in the lowermost part including an inside of the reverse surface through hole to thereby couple the reverse surface plating pattern and the metal layer located on the upper surface of the insulating layer in the lowermost part with a plated via obtained by plating the reverse surface through hole are executed.

According to this method, when laminating the plurality of plated-via laminated bodies, since the metal layer which is patterned, and the plated via to be coupled to this metal layer are not formed on the obverse surface and the reverse surface, the pressure dispersion when performing the lamination can be homogenized, and thus, it is possible to prevent the distortion from occurring.

Further, it can be characterized in that when laminating the plurality of the plated-via laminated bodies, as the laminated body located at a reverse surface side of the multilayer substrate, a laminated body in which a single metal layer is formed between two insulating layers, and no plated via is formed is used.

As described above, by adjusting the number of the metal layers of the laminated body located at the reverse surface side, it is possible to adjust the final number of layers of the multilayer substrate.

Further, it can be characterized in that the step of manufacturing the plated-via laminated body includes a step of bonding a metal laminated body including three metal layers, a base member shaped like a plate, and a bonding layer disposed between the metal laminated body and the base member with thermocompression bonding to form a support body, a step of separating a first metal layer as an uppermost surface of the metal laminated body, a step of forming a first plating pattern on an obverse surface of a second metal layer which becomes the uppermost surface subsequently to the metal layer separated in the metal laminated body, a step of forming a first insulating layer formed of insulating resin on the obverse surface of the second metal layer on which the first plating pattern is formed, a step of forming a first through hole penetrating the first insulating layer up to an obverse surface of the first plating pattern, a step of forming a second plating pattern on an obverse surface of the first insulating layer including an inside of the first through hole to thereby couple the first plating pattern and the second plating pattern with a plated via obtained by plating the first through hole, a step of forming a second insulating layer formed of insulating resin on the obverse surface of the first insulating layer on which the second plating pattern is formed, and a step of separating a third metal layer and the second metal layer out of the base member, the bonding layer and the metal laminated body, and the step of interlayer-coupling the plurality of the plated-via laminated bodies with the conductive paste includes a step of forming a second through hole penetrating the second insulating layer up to an obverse surface of the second plating pattern in any of the plurality of the plated-via laminated bodies, a step of filling the second through hole with a conductive paste, and a step of performing lamination so that the conductive paste in the plated-via laminated body filled with the conductive paste makes contact with the first plating pattern of another plated-via laminated body.

According to this configuration, the plated-via laminated bodies which have been manufactured in a coreless manner can be laminated with the paste via, and it is possible to reliably realize the multilayer of the miniaturized plating patterns.

Further, it can be characterized in that the support body is configured by sandwiching a metal layer smaller in width than the bonding layer between the metal laminated body formed of the three metal layers and the bonding layer.

It is possible for the metal layer narrow in width to prevent the bonding layer from scattering when pressurizing the support body, and even when the bonding layer flows from the end surface, the separation can easily be achieved due to the metal layer narrow in width when separating the bonding layer from the plated-via laminated body.

Further, it can be characterized in that in the support body, the metal laminated body formed of the three metal layers, and the bonding layer disposing between the metal laminated body and the base member are disposed at both surface sides of the base member, and two plated-via laminated bodies are simultaneously formed after separating the third metal layer and the second metal layer out of the base member, the bonding layer and the metal laminated body.

According to this configuration, an increase in thickness of the support body can prevent the deformation and so on of the miniaturized plating pattern when being conveyed, and makes contribution to the shortening of the manufacturing process since the two plated-via laminated bodies are formed at the same time.

Further, according to the electronic device related to the invention, the electronic device is characterized in that an electronic component is mounted on one of the above multilayer substrate.

Advantageous Effects of Invention

According to the invention, since the interlayer coupling with the plated via is included in addition to the interlayer coupling with the conductive paste, it is possible to decrease the interlayer resistance value to thereby increase the allowable current value.

DESCRIPTION OF EMBODIMENTS (Multilayer Substrate)

Figure 1:
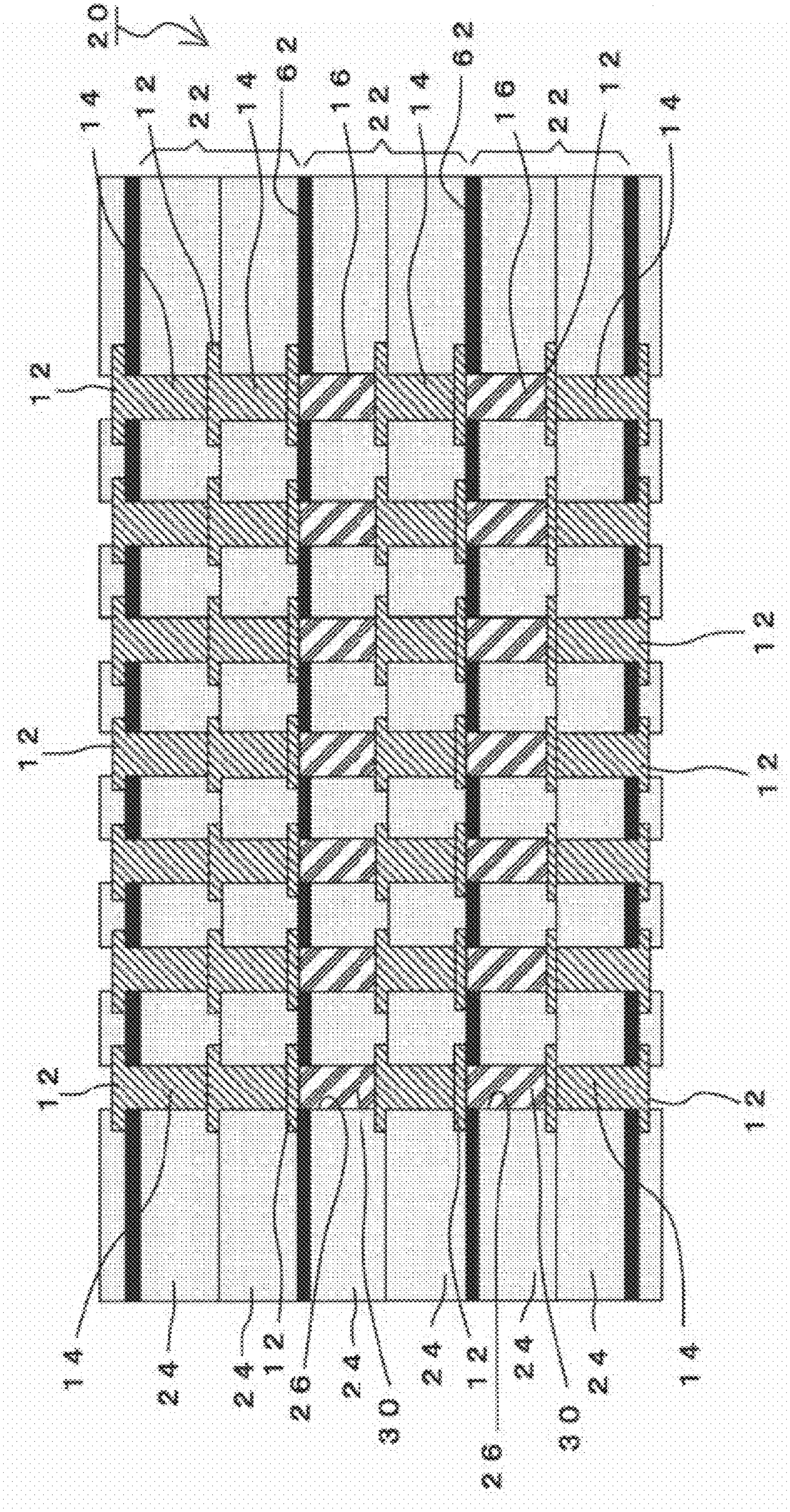
FIG. 1 is a schematic cross-sectional view showing an example of a multilayer substrate.

A schematic cross-sectional view of a multilayer substrate is shown in FIG. 1.

In a multilayer substrate 20 in the present embodiment, there exist both of a layer in which interlayer coupling of metal layers 12 which are patterned, and which are formed on both surfaces of an insulating layer 24 is achieved by plated vias 14, and a layer in which the interlayer coupling thereof is achieved by paste vias 16.

It should be noted that the layers interlayer-coupled with the paste vias 16 are not formed in a row in a lamination direction, but layers at both sides in a vertical direction of the layers interlayer-coupled with the paste vias 16 are interlayer-coupled with the plated vias 14.

A plurality of insulating layers 24 including layers interlayer-coupled with the plated vias 14 is arranged in a row, and is configured as a plated-via laminated body 22. In other words, the plated-via laminated body 22 is formed by interlayer-coupling the metal layers which are patterned, and which are formed on the both surfaces of the plurality of insulating layers 24 to each other with the plated vias 14.

Further, the plated-via laminated bodies 22 are interlayer-coupled to each other with the paste vias 16. Therefore, the layers interlayer-coupled with the paste vias 16 are not formed in a row in the lamination direction.

Lamination of the plated-via laminated bodies 22 is formed by providing through holes 26 which reach an upper surface of the metal layer 12 which is patterned and is formed on the uppermost surface of the plated-via laminated body 22 to the insulating layer 24 of a predetermined plated-via laminated body 22, filling the through holes 26 with a conductive paste 30, and arranging an upper surface of the conductive paste 30 so as to make contact with the metal layer 12 which is patterned, and which is formed on a lower surface of the plated-via laminated body 22 located at an upper side.

Further, insulating bonding layers 62 are disposed on both of upper and lower surfaces of each of the plated-via laminated bodies 22, and the lamination of the plated-via laminated bodies 22 is achieved by the insulating bonding layers 62. In contrast, lamination of the insulating layers 24 in the inside of each of the plated-via laminated bodies 22 is achieved without using bonding layers.

(Method for Manufacturing Multilayer Substrate)

Then, a method for manufacturing a laminated body constituting the multilayer substrate and a method for manufacturing the multilayer substrate obtained by laminating a plurality of laminated bodies will be described.

It should be noted that the reason that there are used the expressions of an upper surface and a lower surface of the support body in the following description is that the support body forms the two laminated bodies in a vertically symmetrical manner, and illustration is made setting the lamination direction of the support body as the vertical direction, and therefore, these expressions are used based on the vertical direction on the drawings. In contrast, regarding the completed laminated body and the multilayer substrate obtained by laminating the laminated bodies, the expressions of an obverse surface and a reverse surface are used.

Figure 2:
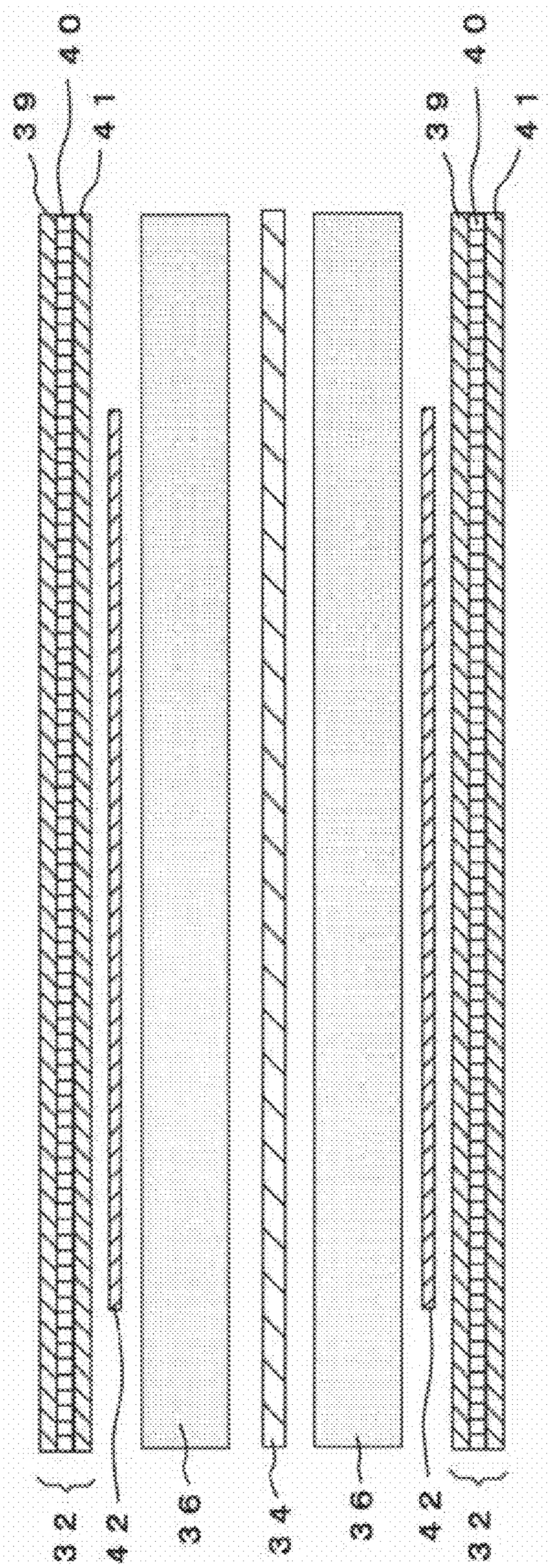
FIG. 2 is a schematic cross-sectional view (part 1) showing an example of a method for manufacturing a support body.
Figure 3:
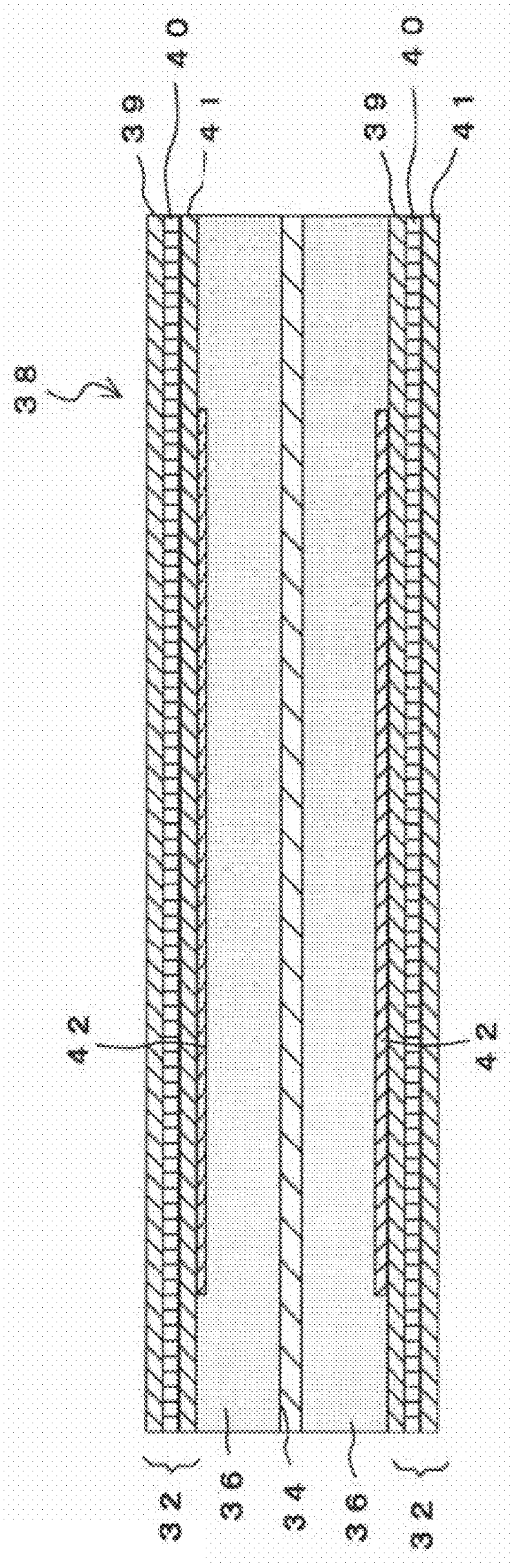
FIG. 3 is a schematic cross-sectional view (part 2) showing the example of the method for manufacturing the support body.

First, as shown in FIG. 2 through FIG. 3, a metal laminated body 32 constituted by three metal layers, a base member 34 shaped like a plate, and a bonding layer 36 disposed between the metal laminated body 32 and the base member 34 are bonded to each other with thermocompression bonding to form a support body 38.

The three layers of the metal laminated body 32 is constituted by the three layers, namely a copper foil as a first metal layer 39, a nickel foil as a second metal layer 40, and a copper foil as a third metal layer 41, for example, from an upper side. It should be noted that types of the metals and a lamination order are not limited thereto.

Although a copper-clad laminate (CCL), for example, can be adopted as the base member 34 shaped like a plate, the copper-clad laminate is not particularly a limitation.

Further, as the bonding layer 36, it is possible to adopt, for example, a pre-preg (what is obtained by impregnating an unwoven fabric substrate such as glass fiber or a woven fabric substrate with epoxy resin or the like). It should be noted that the bonding layer 36 is not limited to the pre-preg.

Further, in the present embodiment, a metal layer 42 narrower than the bonding layer 36 is disposed between the metal laminated body 32 and the bonding layer 36. Although it is possible to adopt, for example, a copper foil as the metal layer 42, the metal layer 42 is not particularly limited to the copper foil. By arranging such a metal layer 42, the pre-preg as the bonding layer 36 is prevented from scattering when performing the thermocompression bonding when manufacturing the support body 38, or by arranging the metal layer 42, exfoliation from the metal laminated body 32 becomes easy even when the pre-preg as the bonding layer 36 protrudes from an end surface.

It should be noted that in the present embodiment, the bonding layers 36, the metal layers 42 narrow in width, and the metal laminated bodies 32 are disposed at both of upper and lower sides of the base member 34 shaped like a plate.

Therefore, the support body 38 is constituted by the metal laminated body 32, the metal layer 42 narrow in width, the bonding layer 36, the base member 34 shaped like a plate, the bonding layer 36, the metal layer 42 narrow in width, and the metal laminated body 32 bonded on one another from the upper side with the thermocompression bonding in an integrated manner.

Further, it is assumed that the metal laminated body 32 disposed at the lower side of the base member 34 shaped like a plate is constituted by the three layers, namely the copper foil as the first metal layer 39, the nickel foil as the second metal layer 40, and the copper foil as the third metal layer 41 from the lowermost surface.

Further, it is preferable to provide an alliance hole penetrating the laminated layers to the support body 38 in order to form an alliance, but the alliance hole is omitted from the drawings.

Figure 4:
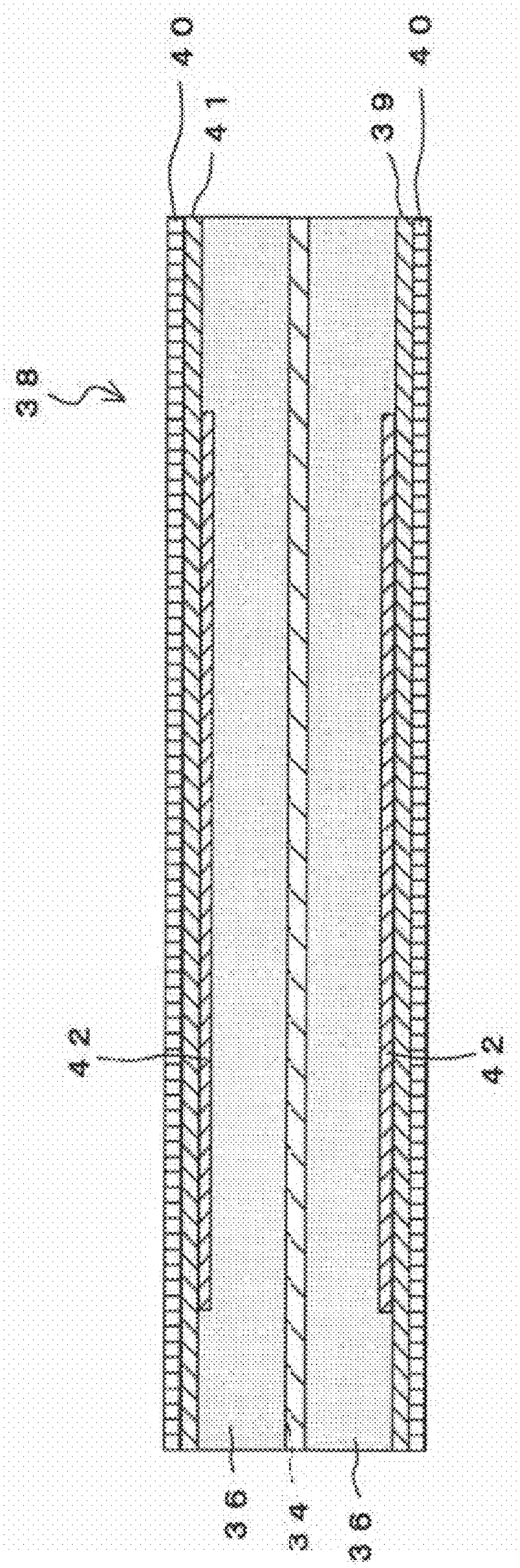
FIG. 4 is a schematic cross-sectional view (part 3) showing the example of the method for manufacturing the support body.

Then, as shown in FIG. 4, the first metal layer 39 on the uppermost surface of the support body 38 and the first metal layer 39 on the lowermost surface of the support body 38 are separated.

In the present embodiment, the first metal layers 39 are made of copper, and the first metal layers 39 are separated by etching.

By separating the first metal layers 39, the second metal layers 40 made of nickel are exposed on both of upper and lower surfaces of the support body 38.

Figure 5:
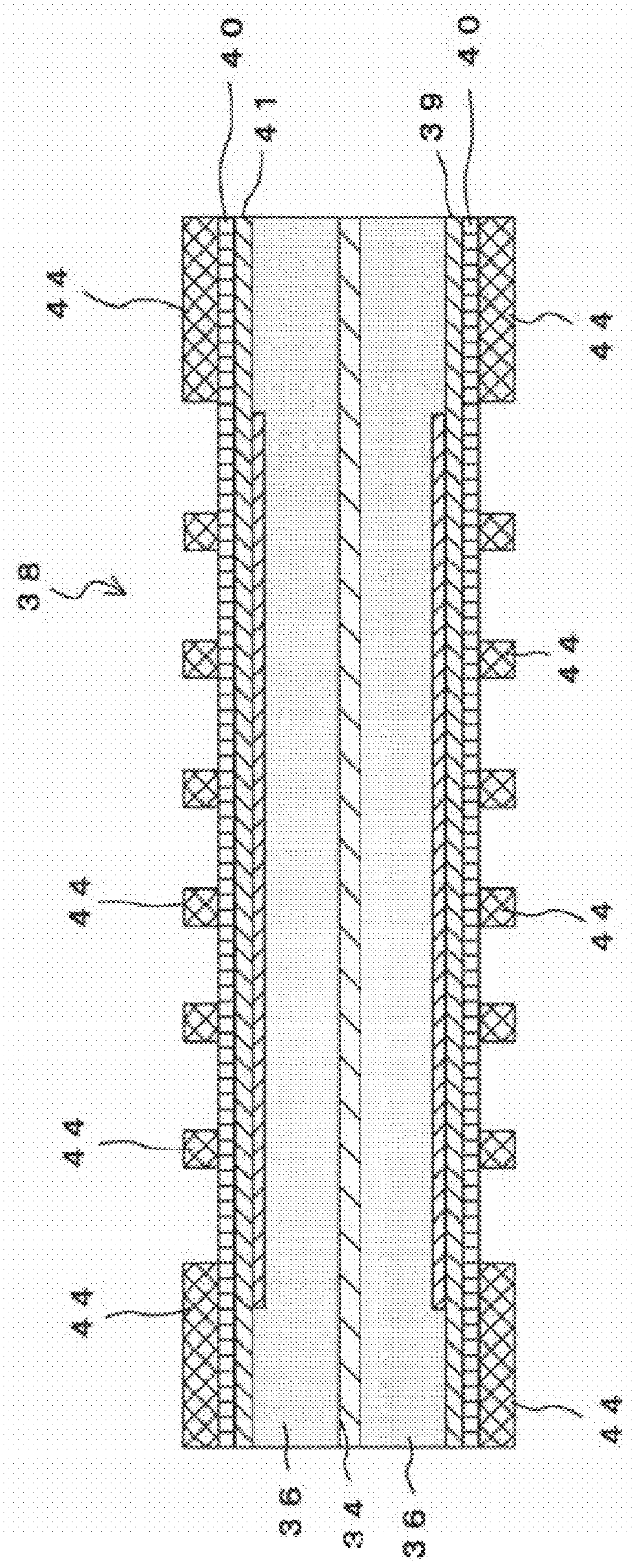
FIG. 5 is a schematic cross-sectional view (part 4) showing the example of the method for manufacturing the support body.

Further, as shown in FIG. 5, resist layers 44 are formed on surfaces of the second metal layers 40 thus exposed. As the resist layers 44, there can be used, for example, dry film resist (DFR) shaped like a film.

After attaching the dry film resist on the surfaces of the second metal layers 40, exposure with a predetermined pattern is performed to remove unwanted parts, and thus, the resist layers 44 having predetermined patterns are obtained.

Figure 6:
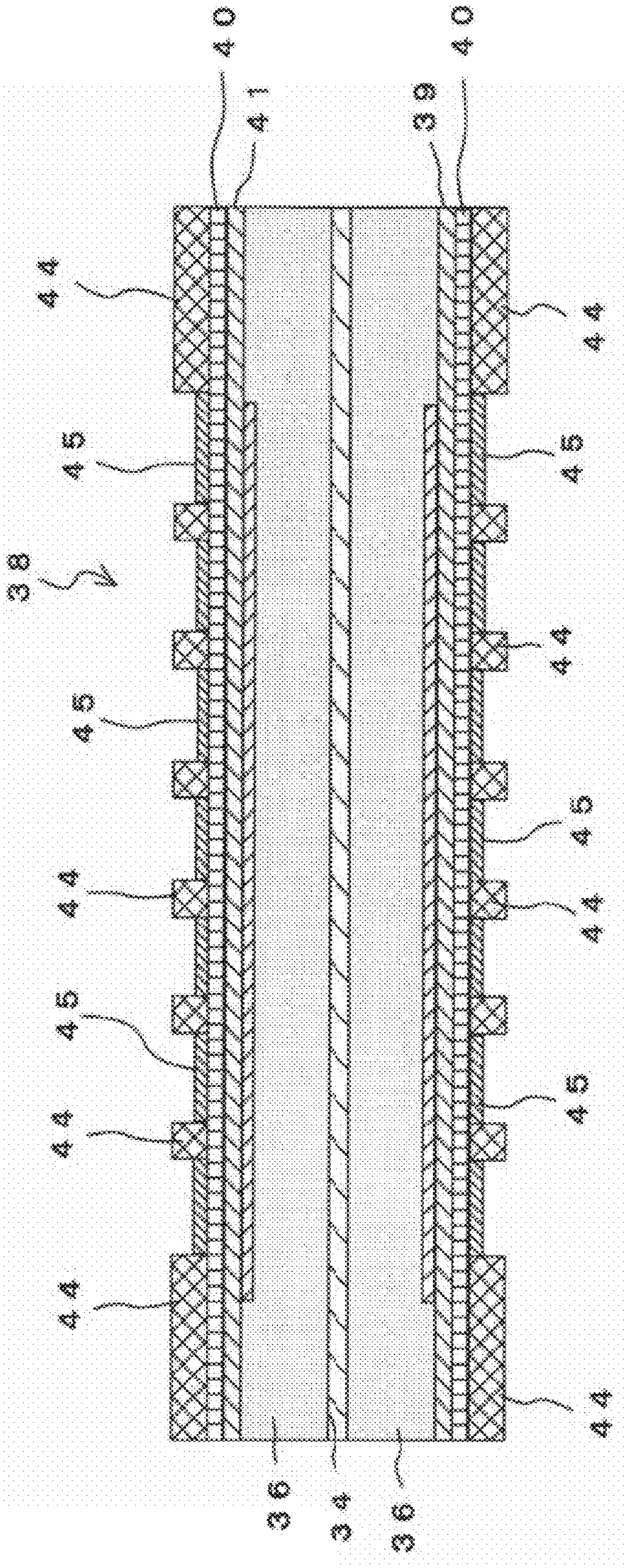
FIG. 6 is a schematic cross-sectional view (part 5) showing the example of the method for manufacturing the support body.

Further, as shown in FIG. 6, in places where the resist layers 44 having the predetermined patterns are not formed on both of the upper and lower surfaces of the support body 38, metal layers 45 are formed by plating. The plating can be performed using, for example, electrolytic copper plating, and in this case, the metal layers 45 made of copper are formed.

Figure 7:
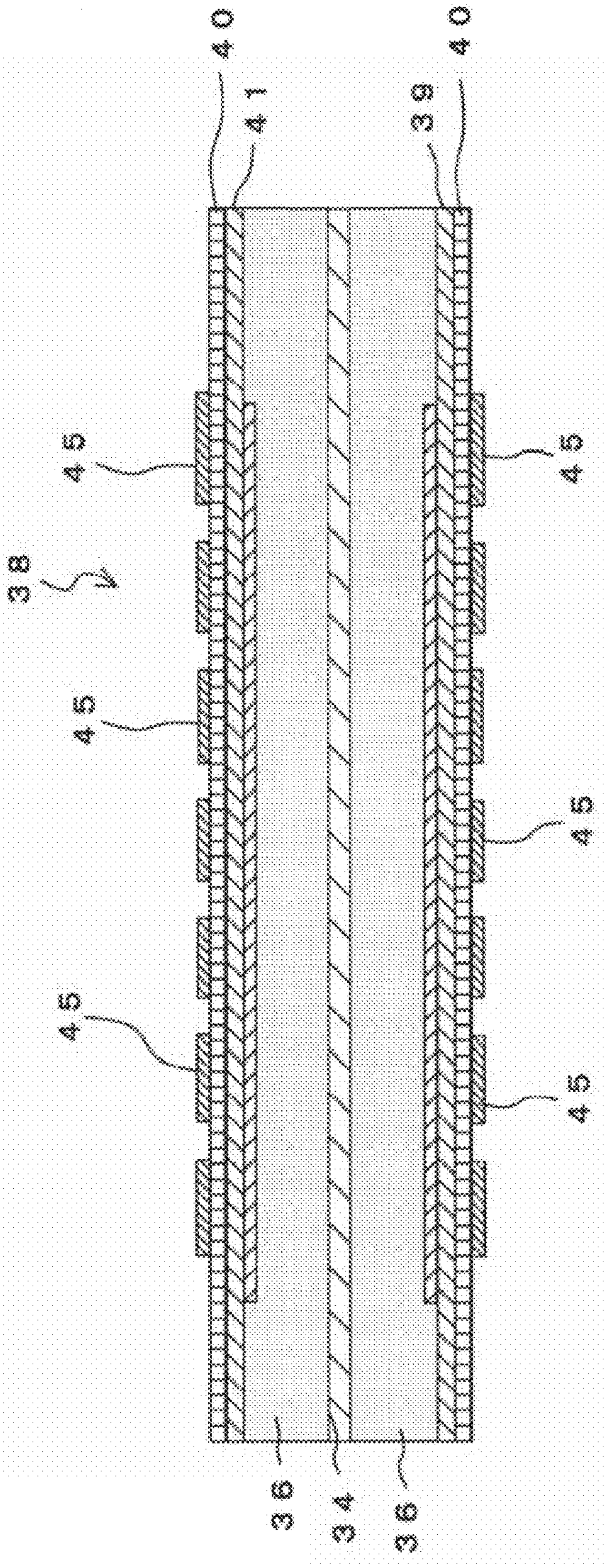
FIG. 7 is a schematic cross-sectional view (part 6) showing the example of the method for manufacturing the support body.

Subsequently, as shown in FIG. 7, the resist layers 44 on both of the upper and lower surfaces of the support body 38 are separated. By separating the resist layers 44, the support body 38 comes into the state in which the metal layers 45 which are made of copper and are patterned on the surfaces of the second metal layers 40 made of nickel are formed on both of the upper and lower surfaces of the support body 38.

Further, since insulating layers 46 are formed on surfaces of the metal layers 45 in the subsequent operation, it is possible to perform a roughening treatment on the surfaces of the metal layers 45 in the present operation to thereby enhance the adhesiveness between the metal layers 45 and the insulating layers 46.

Figure 8:
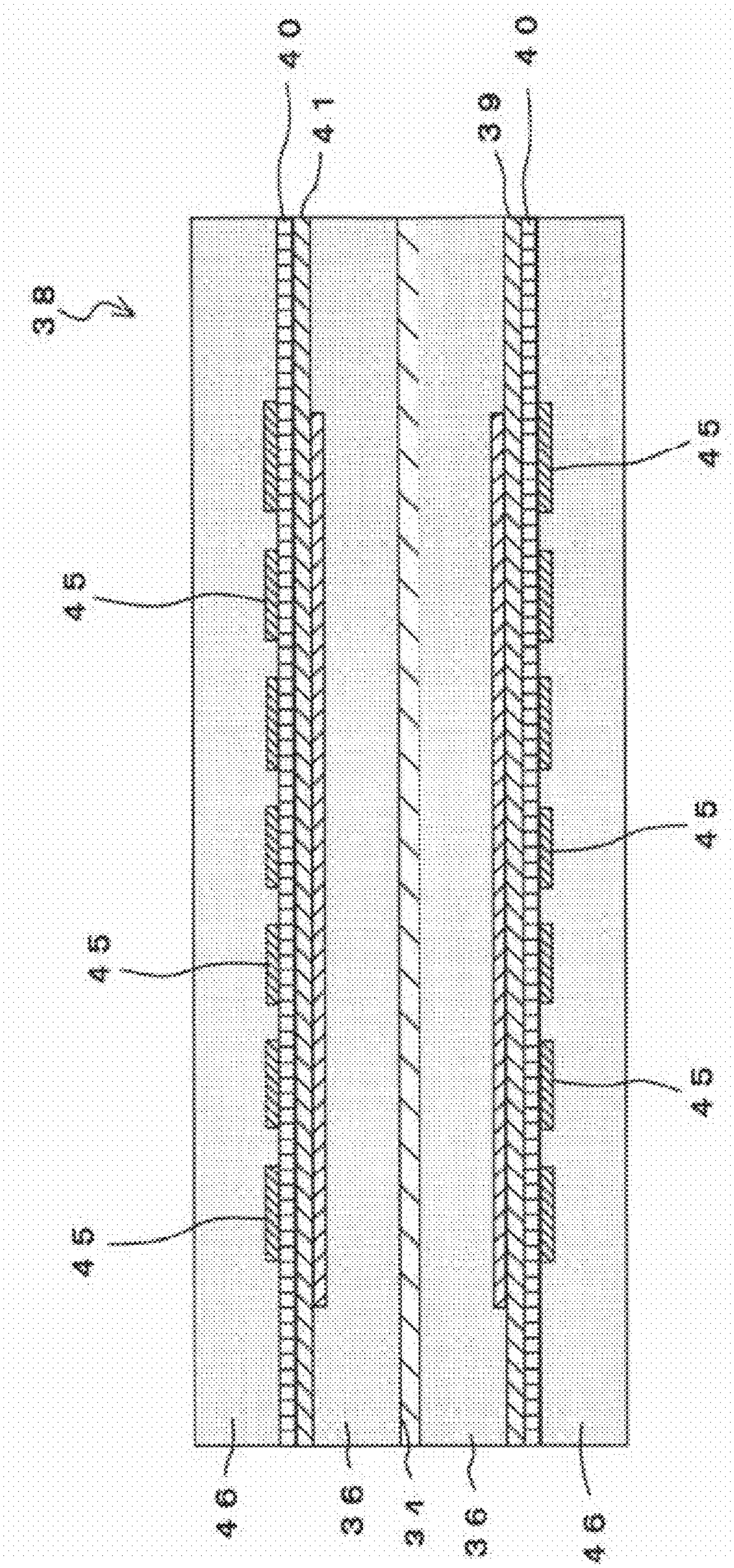
FIG. 8 is a schematic cross-sectional view (part 7) showing the example of the method for manufacturing the support body.

Further, as shown in FIG. 8, the insulating layers 46 are formed on the surfaces of the second metal layers 40 made of nickel and the metal layers 45 which is made of copper and is patterned on both of the upper and lower surfaces of the support body 38. As the insulating layers 46, there can be adopted, for example, thermosetting resin, and thermosetting insulating film can also be adopted.

Figure 9:
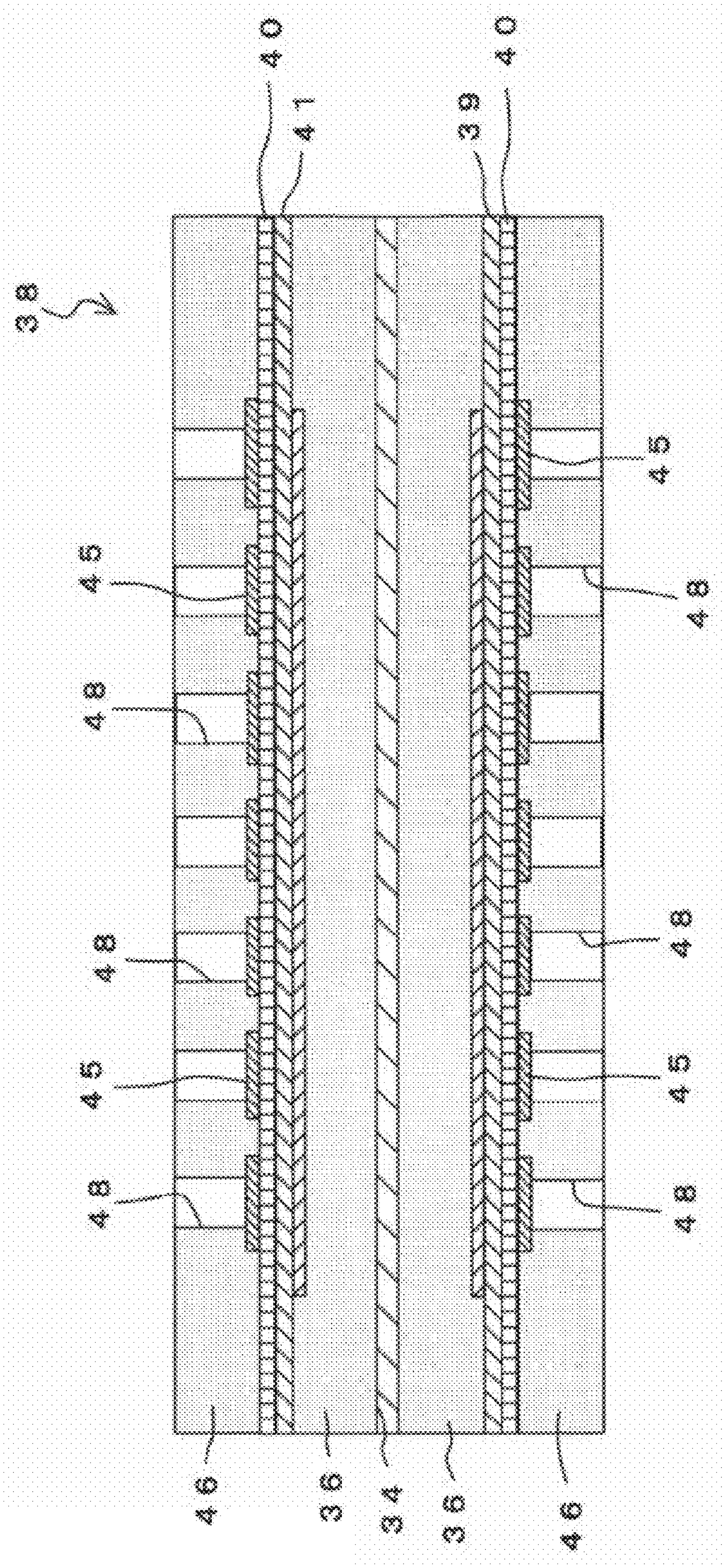
FIG. 9 is a schematic cross-sectional view (part 8) showing the example of the method for manufacturing the support body.

Then, as shown in FIG. 9, through holes 48 which reach the surfaces of the metal layers 45 are formed in the insulating layers 46 on both of the upper and lower surfaces of the support body 38. The formation of the through holes 48 can be performed by laser processing. As the type of the laser when forming the through holes 48 with the laser, a $CO_2$ laser, a YAG laser, and so on can be cited, and can appropriately be selected. Further, the laser output is also not particularly limited, and can appropriately be selected.

Figure 10:
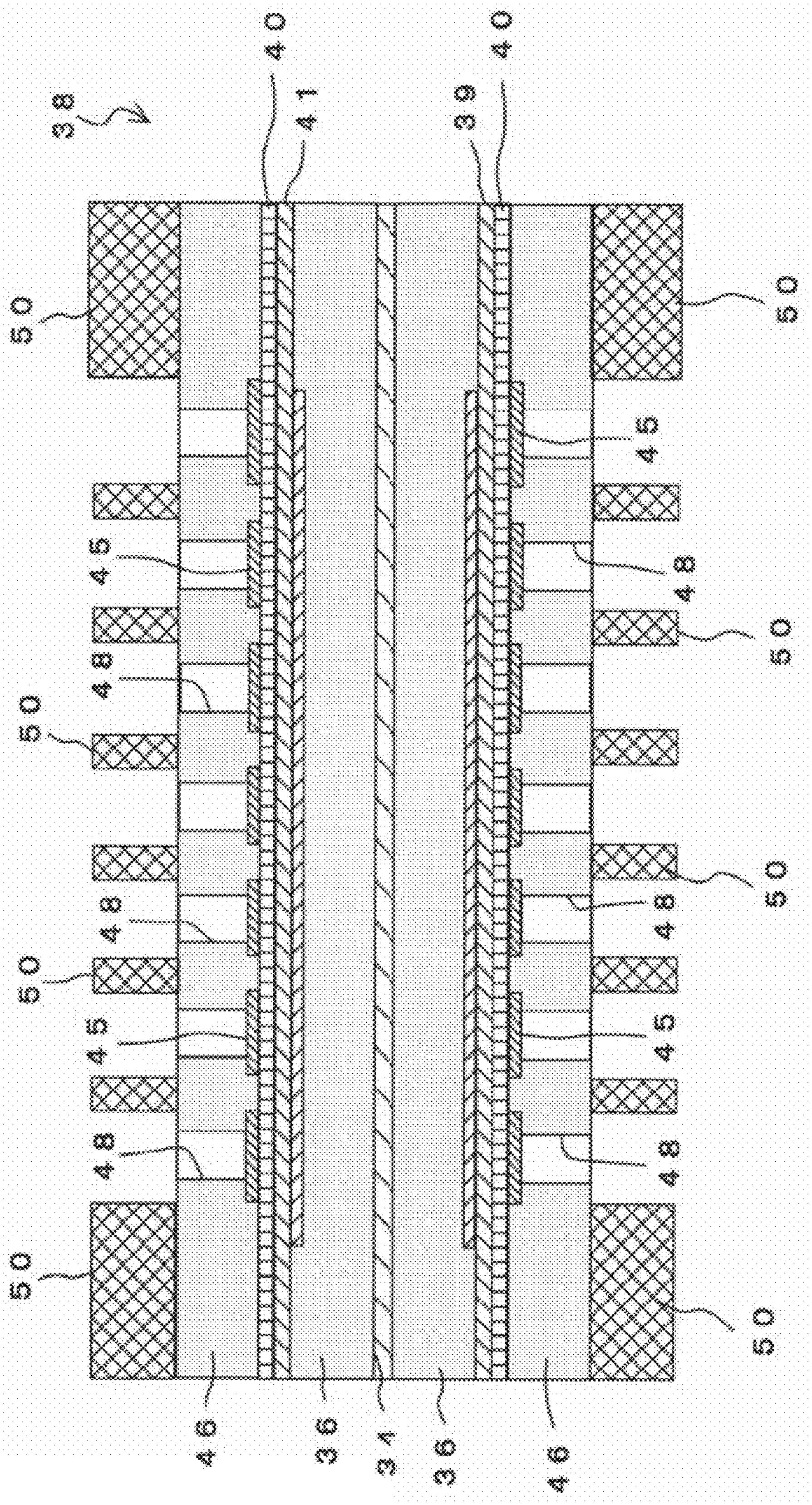
FIG. 10 is a schematic cross-sectional view (part 9) showing the example of the method for manufacturing the support body.

Further, as shown in FIG. 10, resist layers 50 which are patterned are formed on surfaces of the insulating layers 46 on both of the upper and lower surfaces of the support body 38. As the resist layers 50, there can be used, for example, dry film resist (DFR) shaped like a film.

After attaching the dry film resist on the surfaces of the insulating layers 46, exposure with a predetermined pattern is performed to remove unwanted parts, and thus, the resist layers 50 having predetermined patterns are obtained.

Figure 11:
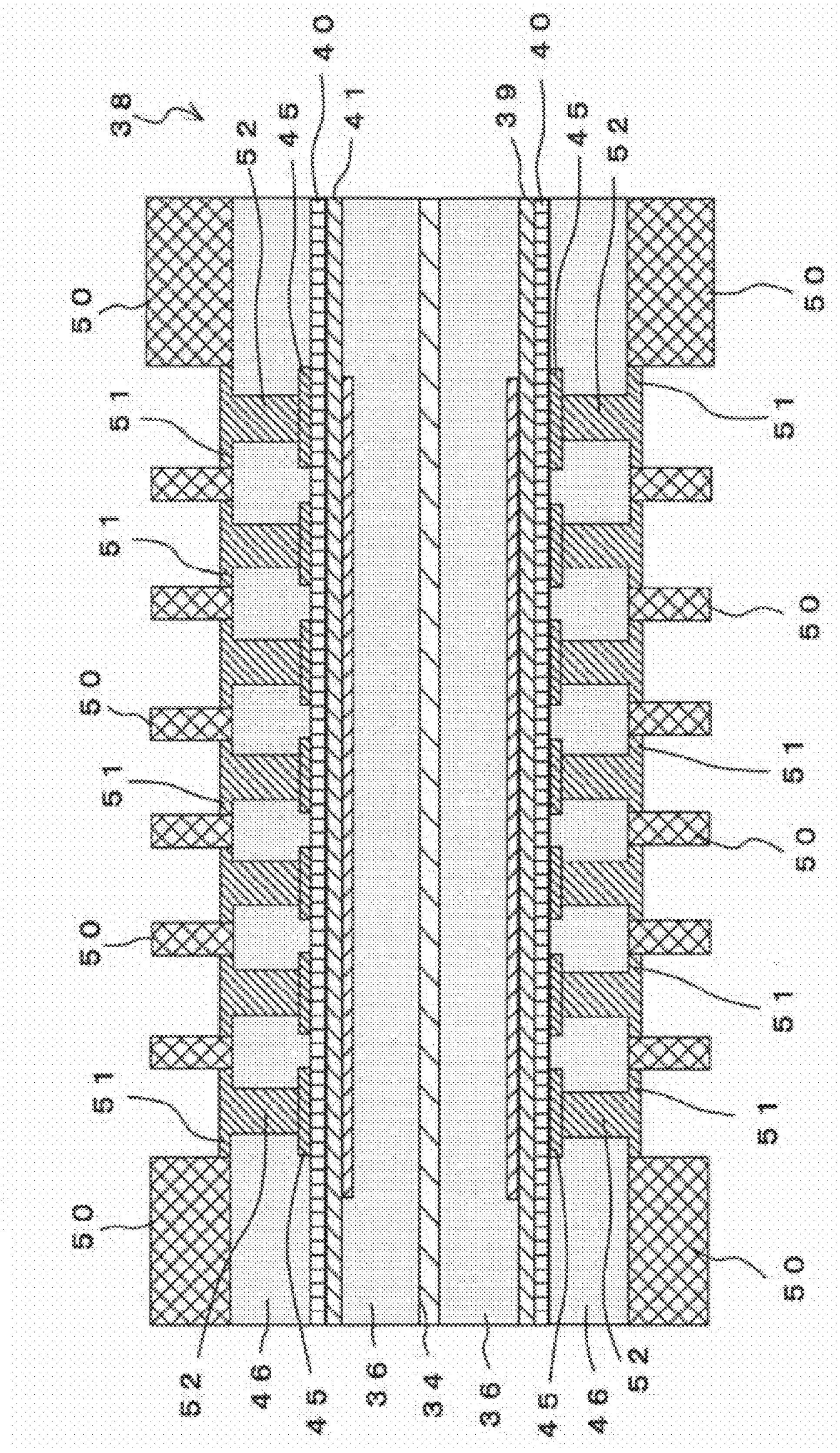
FIG. 11 is a schematic cross-sectional view (part 10) showing the example of the method for manufacturing the support body.

Then, as shown in FIG. 11, plating is performed in places where the resist layers 50 having the predetermined patterns are not formed and the inside of the through holes 48 on both of the upper and lower surfaces of the support body 38. Thus, metal layers 51, and plated vias 52 which is coupled to the metal layer 51, in which the through holes 48 are plated are formed. Further, since the through holes 48 penetrate up to the surface of the metal layer 45 formed in advance, the plated vias 52 are formed so as to couple the metal layers 45 and the metal layers 51 to each other.

It should be noted that the plating can be performed using, for example, electrolytic copper plating, and in this case, the metal layers 51 and the plated vias 52 are formed of copper.

Figure 12:
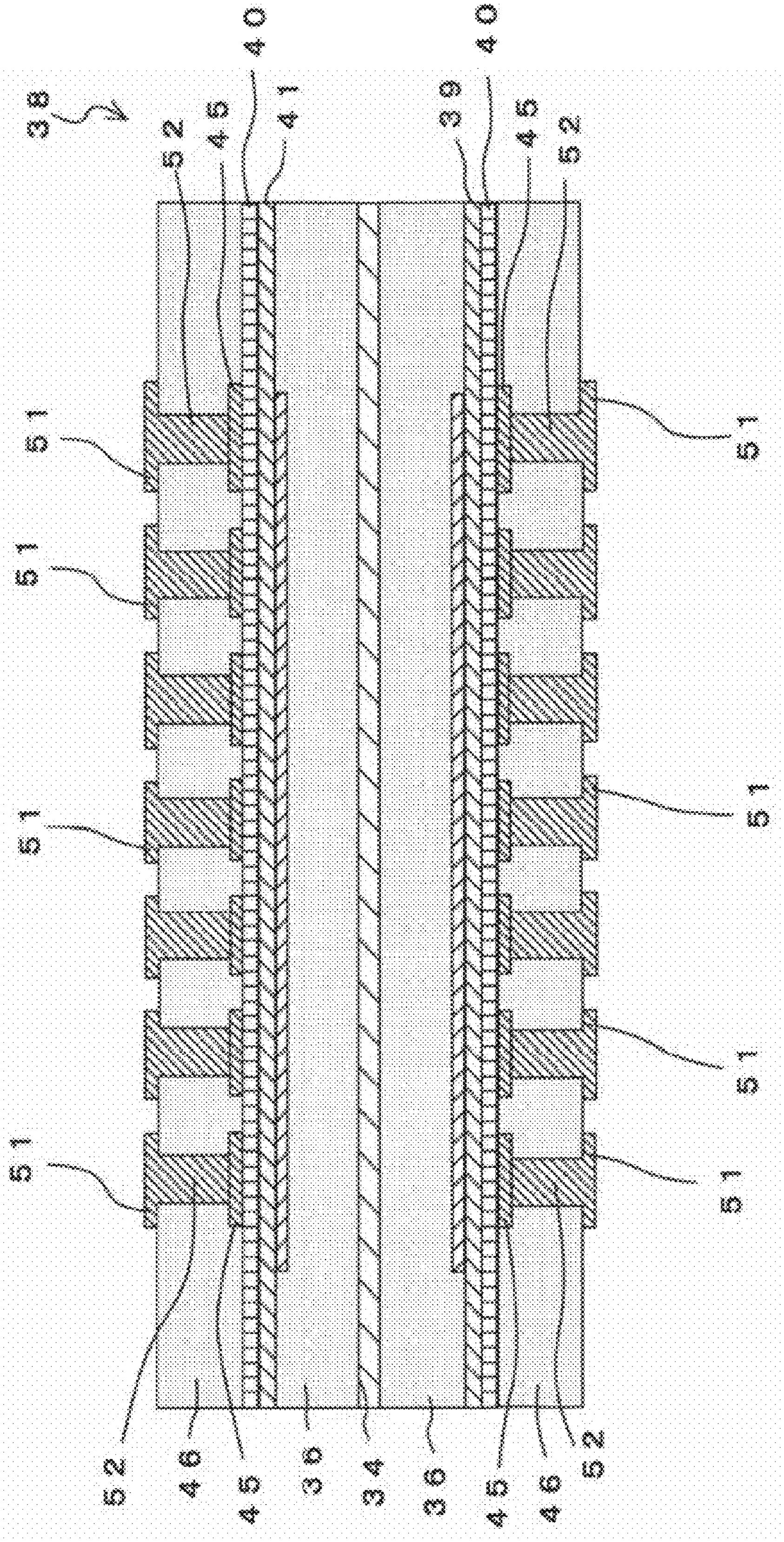
FIG. 12 is a schematic cross-sectional view (part 11) showing the example of the method for manufacturing the support body.

Subsequently, as shown in FIG. 12, the resist layers 50 on both of the upper and lower surfaces of the support body 38 are separated. By separating the resist layers 50, the support body 38 comes into the state in which the metal layers 51 which are patterned on the insulating layers 46 are formed on both of the upper and lower surfaces of the support body 38.

Further, since insulating layers 54 are formed on surfaces of the metal layers 51 in the subsequent operation, it is possible to perform a roughening treatment on the surfaces of the metal layers 51 in the present operation to thereby enhance the adhesiveness between the metal layers 51 and the insulating layers 54.

Figure 13:
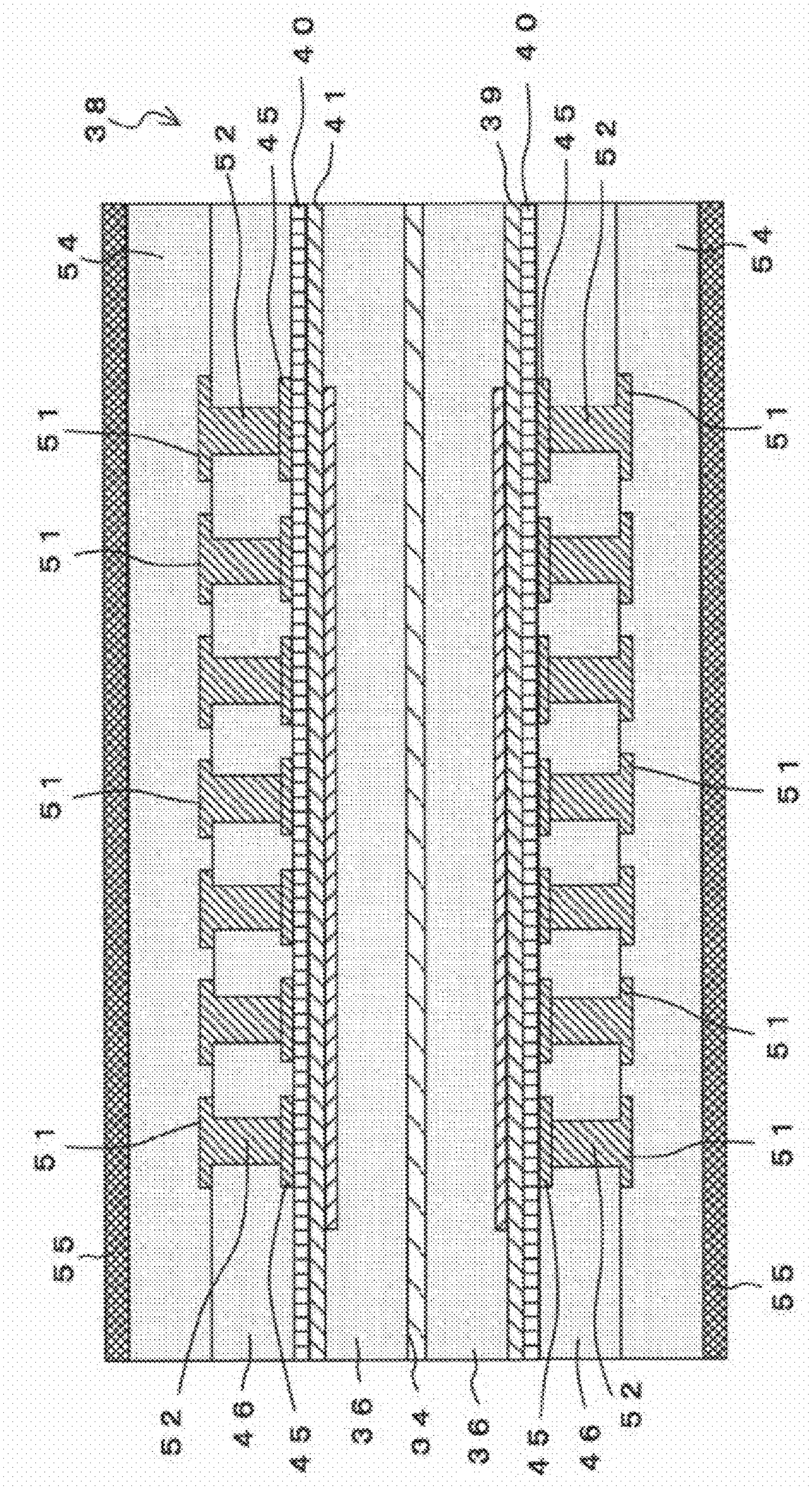
FIG. 13 is a schematic cross-sectional view showing a completed state of the support body.

Further, as shown in FIG. 13, the insulating layers 54 are formed on the insulating layers 46 and the surfaces of the metal layers 51 which are patterned on both of the upper and lower surfaces of the support body 38. As the insulating layers 54, there can be adopted, for example, thermosetting resin, and thermosetting insulating film can also be adopted.

Further, resin films 55 for protection are attached to surfaces of the insulating layers 54 on both of the upper and lower surfaces of the support body 38. Any objects can be adopted as the resin films 55, and it is possible to use, for example, PET films.

Then, the support body 38 is separated to obtain two plated-via laminated bodies 60. Since the two layers of the insulating layer 46 and the insulating layer 54 are formed and then separated as in the present embodiment, it is possible to keep the strength to prevent breakage and so on compared to when separating a single layer.

Figure 14:
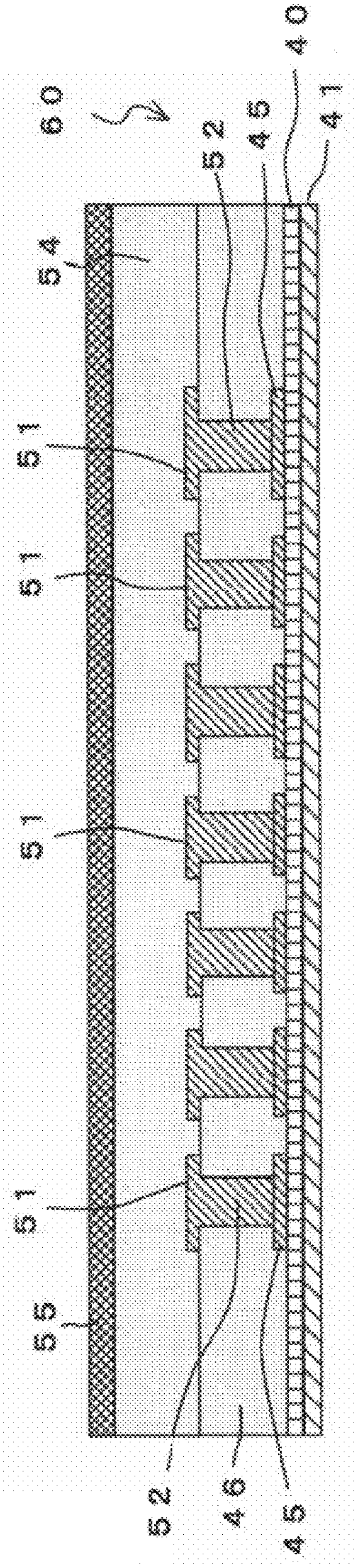
FIG. 14 is a schematic cross-sectional view showing an example of a plated-via laminated body obtained by separating the support body.

The plated-via laminated body 60 which is obtained by the separation is shown in FIG. 14.

Due to the separation of the support body 38, the base member 34 shaped like a plate, the bonding layer 36, and the metal layer 42 narrow in width become unnecessary. It should be noted that when performing the separation, processing of cutting an outside portion of the support body 38 along the lamination direction is performed, but the illustration thereof is omitted here.

The second metal layer 40 made of nickel and the third metal layer 41 made of copper are still disposed on a lower surface of the plated-via laminated body 60.

Figure 15:
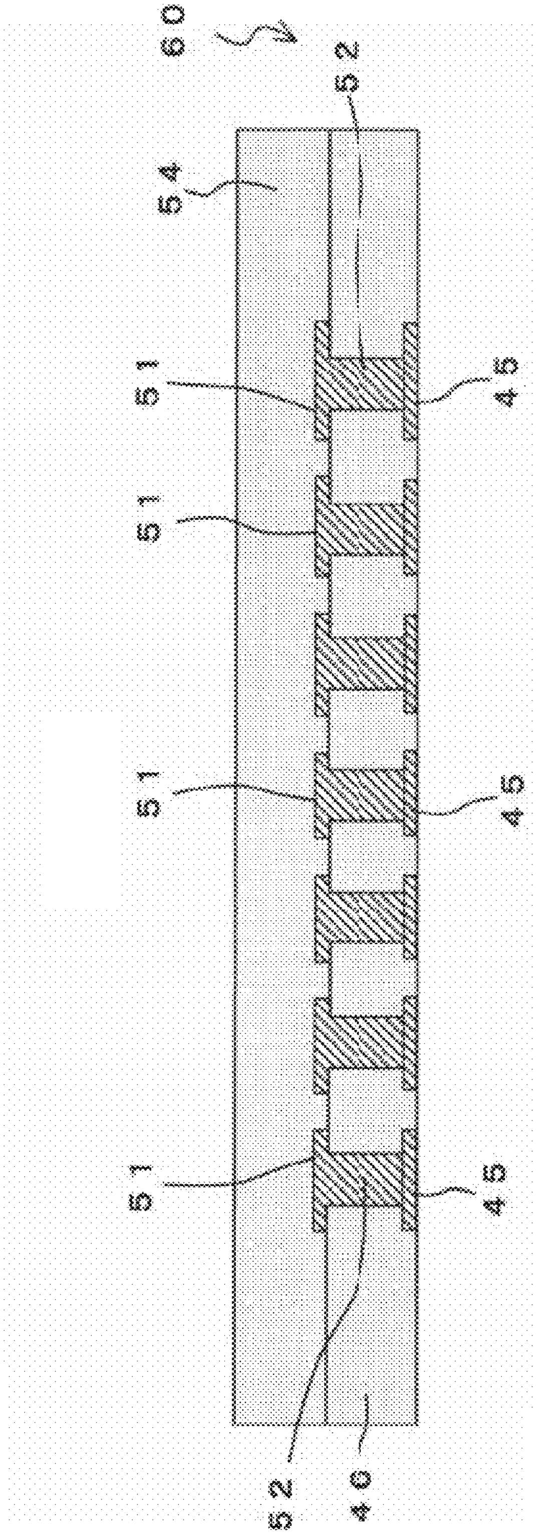
FIG. 15 is a schematic cross-sectional view (part 1) showing an example of a processing process of the plated-via laminated body.

Then, as shown in FIG. 15, the resin film 55 for protecting the plated-via laminated body 60 separated from the support body 38 is separated, and further, the third metal layer 41 and the second metal layer 40 are separated. The separation of the third metal layer 41 and the second metal layer 40 is performed by etching.

Then, an operation of laminating the plated-via laminated bodies 60 with each other will be described.

Figure 16:
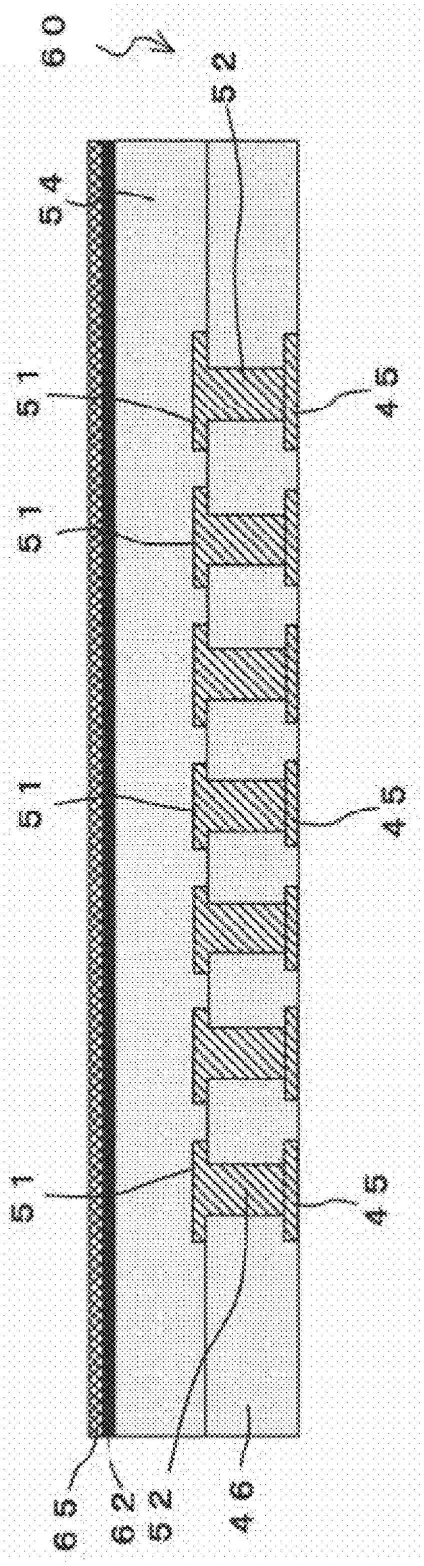
FIG. 16 is a schematic cross-sectional view (part 2) showing the example of the processing process of the plated-via laminated body.

First, as shown in FIG. 16, the insulating bonding layer 62 is formed on an upper surface of the plated-via laminated body 60 located in an intermediate layer out of the plurality of plated-via laminated bodies 60. As the insulating bonding layer 62, it is also possible to adopt a bonding sheet obtained by laminating an adhesive and a separator.

Further, a resin film 65 is attached to an upper surface of the insulating bonding layer 62. Any objects can be adopted as the resin film 65, and it is possible to use, for example, a PET film.

Figure 17:
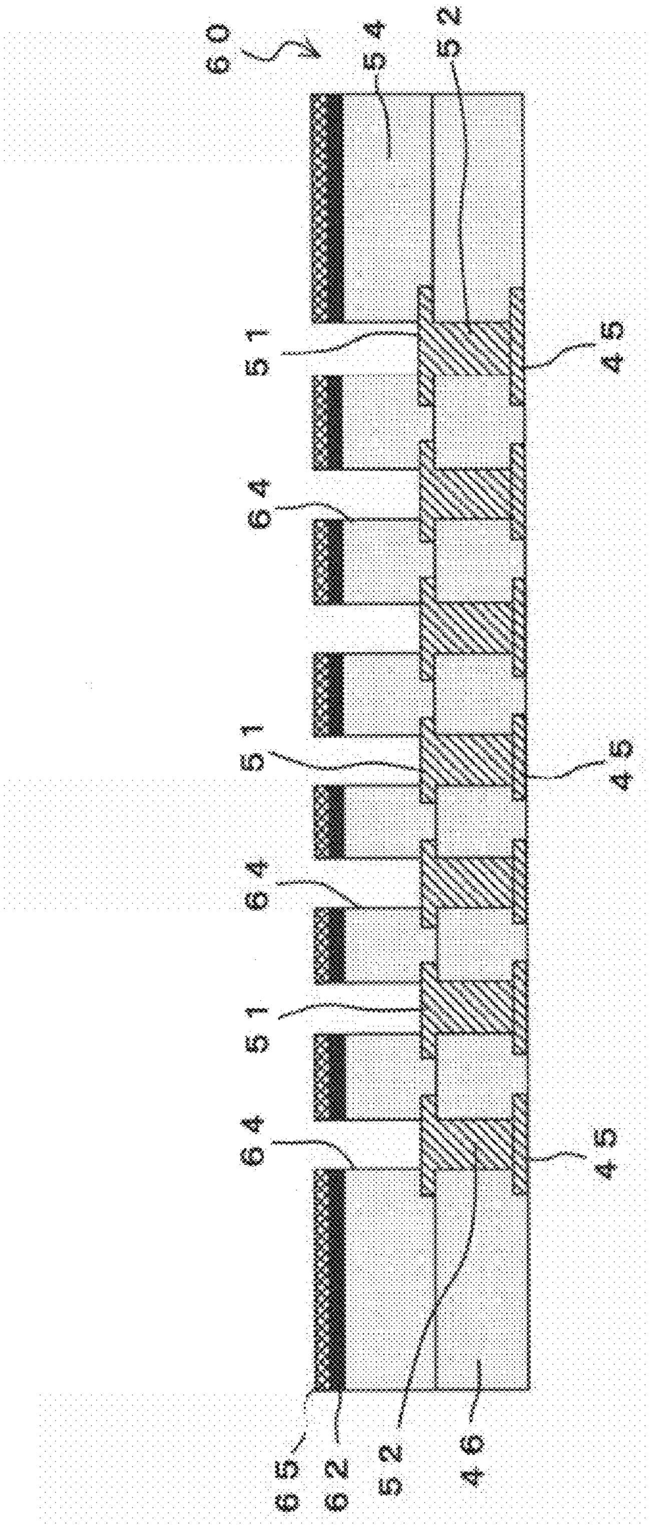
FIG. 17 is a schematic cross-sectional view (part 3) showing the example of the processing process of the plated-via laminated body.

Then, as shown in FIG. 17, through holes 64 which penetrate the resin film 65, the insulating bonding layer 62, and the insulating layer 54 to reach the surface of the metal layer 51 are formed. The formation of the through holes 64 can be performed by laser processing. As the type of the laser when forming the through holes 64 with the laser, a $CO_2$ laser, a YAG laser, and so on can be cited, and can appropriately be selected.

Further, the laser output is also not particularly limited, and can appropriately be selected.

Figure 18:
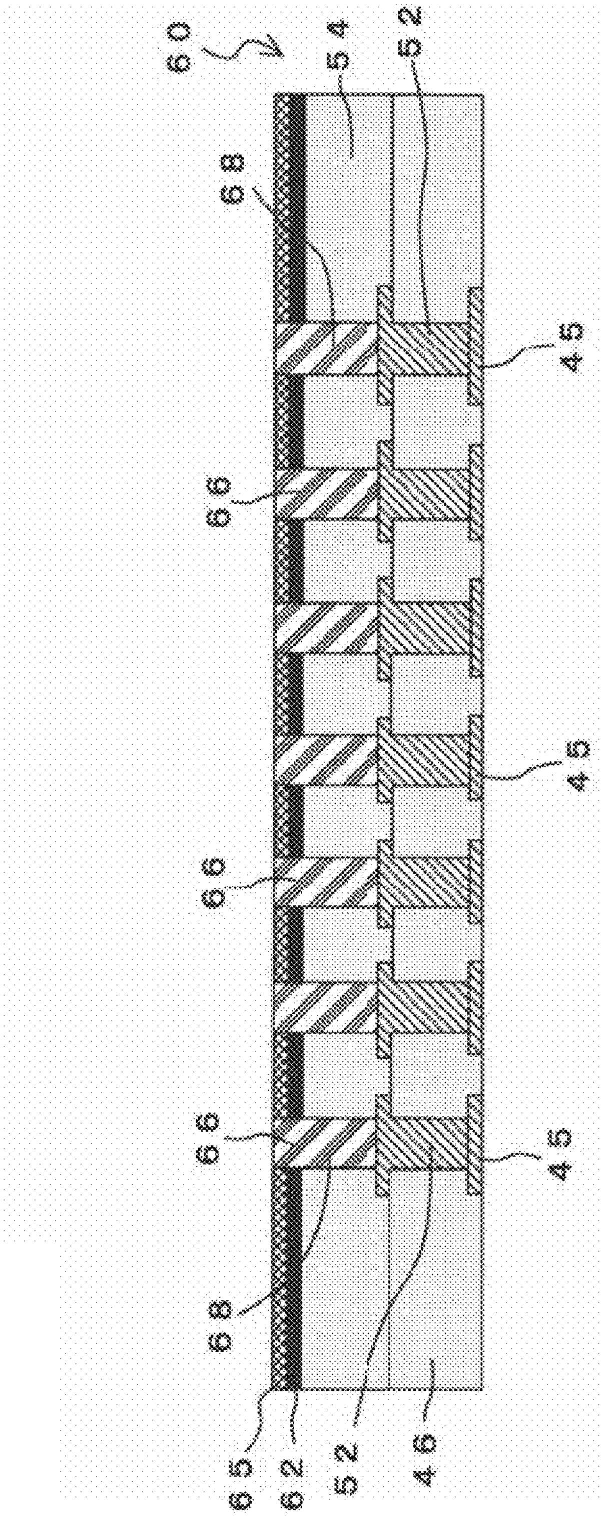
FIG. 18 is a schematic cross-sectional view (part 4) showing the example of the processing process of the plated-via laminated body.

Subsequently, as shown in FIG. 18, the through holes 64 are filled with a conductive paste 66. By filling the through holes 64 with the conductive paste 66, paste vias 68 are formed.

As the conductive paste 66, it is possible to adopt what includes a conductive filler and binder resin.

As the conductive filler, it is possible to cite metal particles made of, for example, copper, gold, silver, palladium, nickel, tin, or bismuth. These metal particles can be used as a single type, or a mixture of two or more types.

As the binder resin, it is possible to adopt, for example, epoxy resin as a type of thermosetting resin. It should be noted that the epoxy resin is not a limitation, and it is possible to adopt polyimide resin or the like. Further, as the binder resin, it is possible to adopt thermoplastic resin instead of the thermosetting resin.

Figure 19:
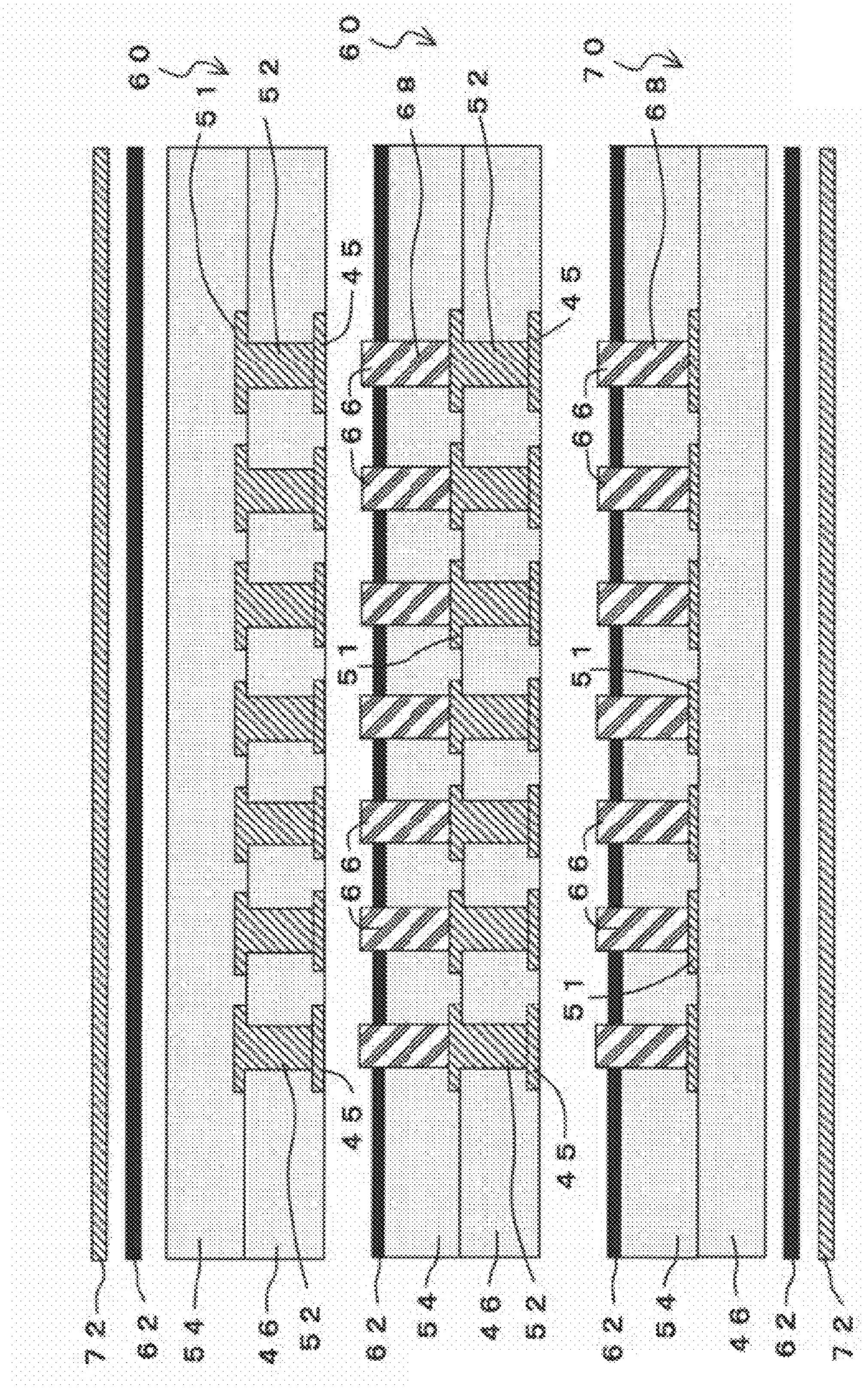
FIG. 19 is a schematic cross-sectional view when stacking a plurality of plated-via laminated bodies and a laminated body to manufacture a completed laminated body.

Then, as shown in FIG. 19, a plurality of plated-via laminated bodies 60 is laminated.

Mutual electrical coupling of the plurality of plated-via laminated bodies 60 is achieved by the paste vias 68 with the conductive paste 66.

Further, although the three laminated bodies are intended to be laminated in FIG. 19, the plated-via laminated body 60 located in an obverse layer (an upper layer) is the laminated body shown in FIG. 15, and is the plated-via laminated body 60 of the type in which the paste via 68 is not formed.

The plated-via laminated body 60 located in the intermediate layer is the plated-via laminated body 60 provided with the paste vias 68 shown in FIG. 18.

Further, a laminated body 70 located in a reverse layer (a lower layer) is a laminated body in which the metal layer 51 which is patterned is formed on the insulating layer 46, the insulating layer 54 is formed on the surface of the metal layer 51, and the insulating bonding layer 62 is formed on the surface of the insulating layer 54, and is provided with the paste vias 68 formed from the metal layer 51 to the insulating bonding layer 62. A method for manufacturing the laminated body in the reverse layer (the lower layer) will be described later.

When laminating the plurality of plated-via laminated bodies 60 and the laminated body 70, the insulating bonding layers 62 are formed on an obverse surface of the plated-via laminated body 60 in the obverse layer and a reverse surface of the laminated body 70 in the reverse layer (the lower layer).

Further, a metal layer 72 is stacked on the insulating bonding layer 62 in the obverse surface of the plated-via laminated body 60 in the obverse layer. Further, similarly, the metal layer 72 is stacked on the insulating bonding layer 62 in the reverse surface of the laminated body 70 in the reverse layer (the lower layer).

As the insulating bonding layer 62, it is possible to adopt a bonding sheet obtained by laminating an adhesive and a separator. Further, as the metal layer 72 to be stacked on the insulating bonding layer 62, it is possible to adopt a metal layer made of copper.

Figure 20:
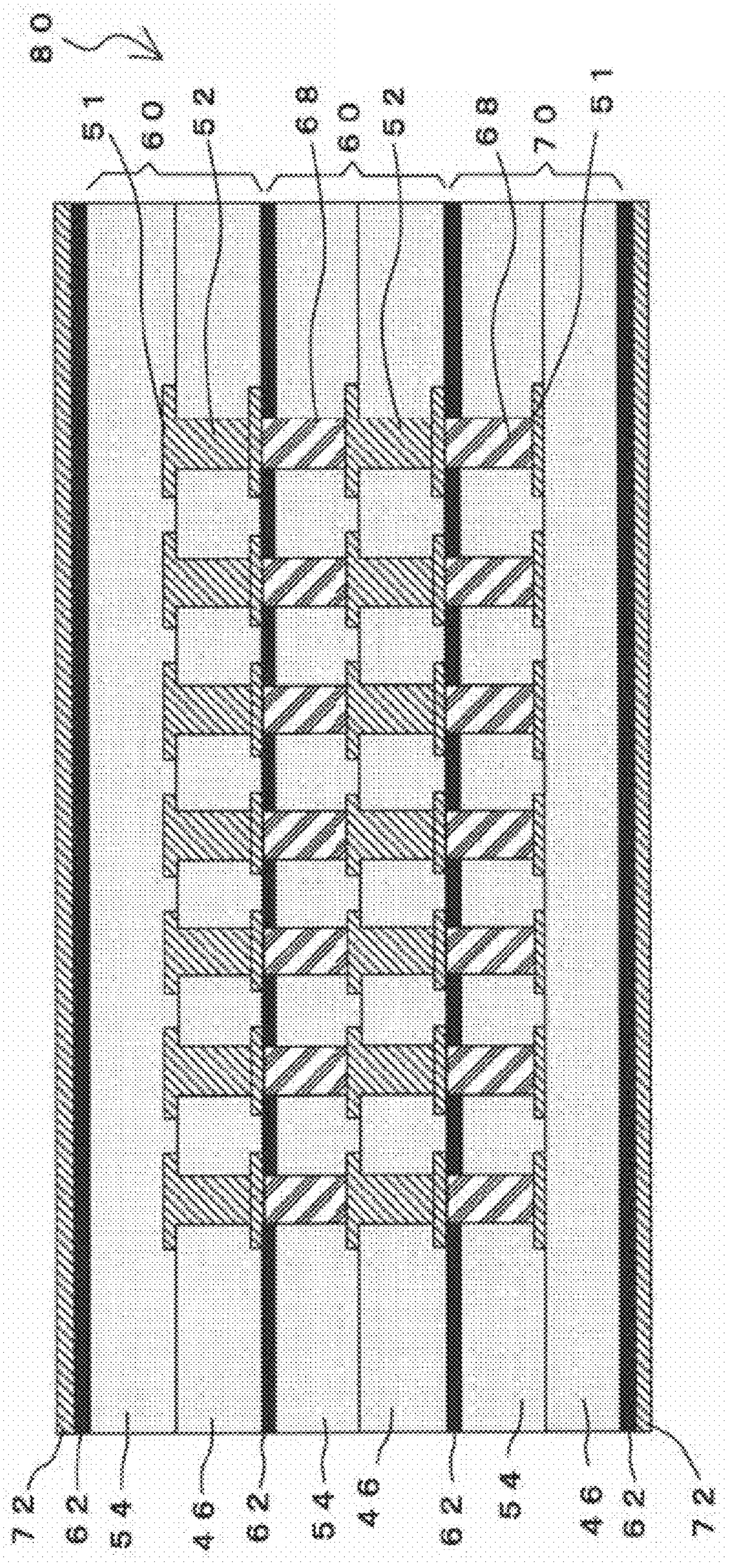
FIG. 20 is a schematic cross-sectional view showing a completed state of the completed laminated body.

A completed laminated body 80 obtained by laminating the plurality of plated-via laminated bodies is shown in FIG. 20.

In the present embodiment, the completed laminated body 80 is formed by setting the plated-via laminated body 60 of the type in which the paste vias 68 are not formed shown in FIG. 15 as the obverse layer, setting the plated-via laminated body 60 provided with the paste vias 68 shown in FIG. 18 as the intermediate layer, setting the laminated body 70 (not provided with the plated via) provided with the paste vias 68 as the reverse layer (the lower layer), laminating the insulating bonding layers 62 and the metal layers 72 on both of the obverse surface and the reverse surface, and then performing the thermocompression bonding.

In the completed laminated body 80, the paste vias 68 in the plated-via laminated body 60 in the intermediate layer are coupled to the metal layer 45 disposed on the lower surface of the plated-via laminated body 60 in the obverse layer, and the paste vias 68 in the laminated body 70 in the reverse layer (the lower layer) are coupled to the metal layer 45 disposed on the lower surface of the plated-via laminated body 60 in the intermediate layer.

Figure 21:
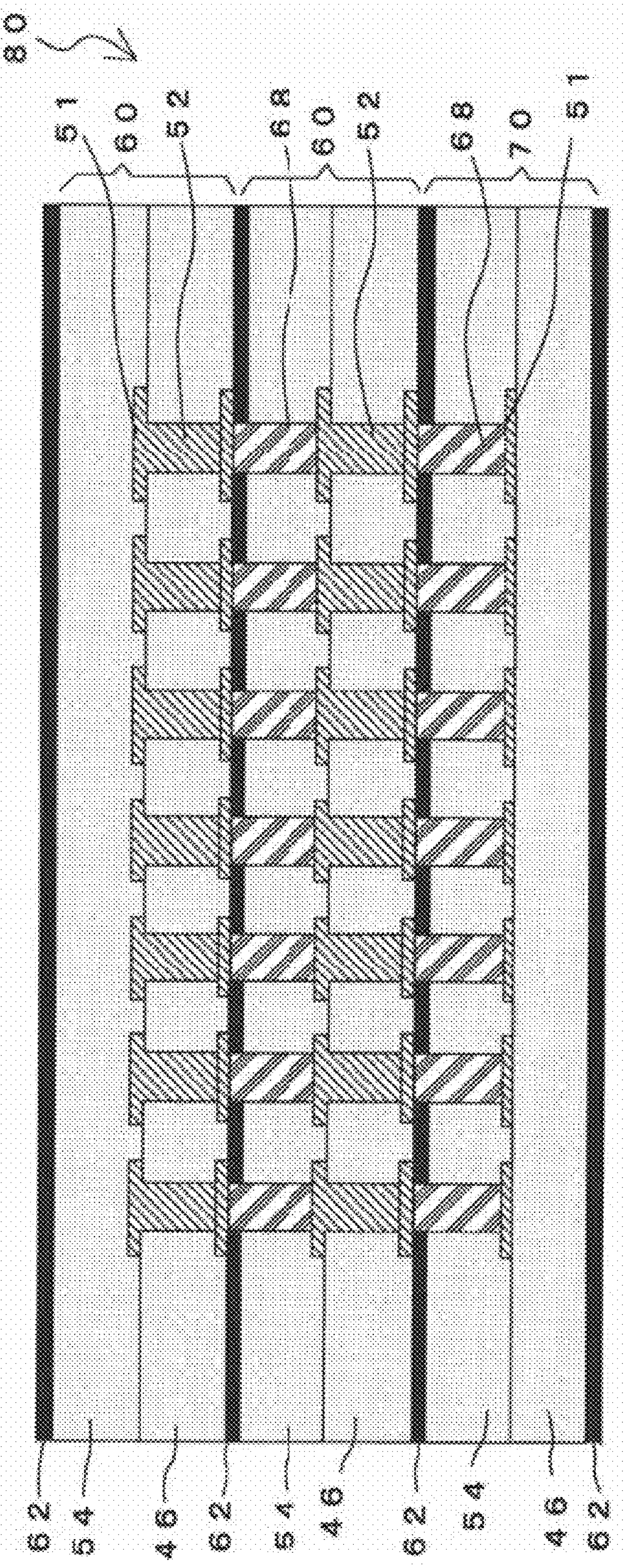
FIG. 21 is a schematic cross-sectional view (part 1) showing an example of a processing process of the completed laminated body.

A state in which the metal layers 72 on an obverse surface and a reverse surface of the completed laminated body 80 are separated is shown in FIG. 21.

The separation of the metal layers 72 on the obverse surface and the reverse surface of the completed laminated body 80 is performed by etching.

It should be noted that since metal layers which are patterned are not formed on the obverse surface and the reverse surface of the completed laminated body 80 in the state of the completed laminated body 80, a process of forming the metal layers which are patterned on the obverse surface and the reverse surface of the completed laminated body 80 to achieve a multilayer substrate will be described below.

Figure 22:
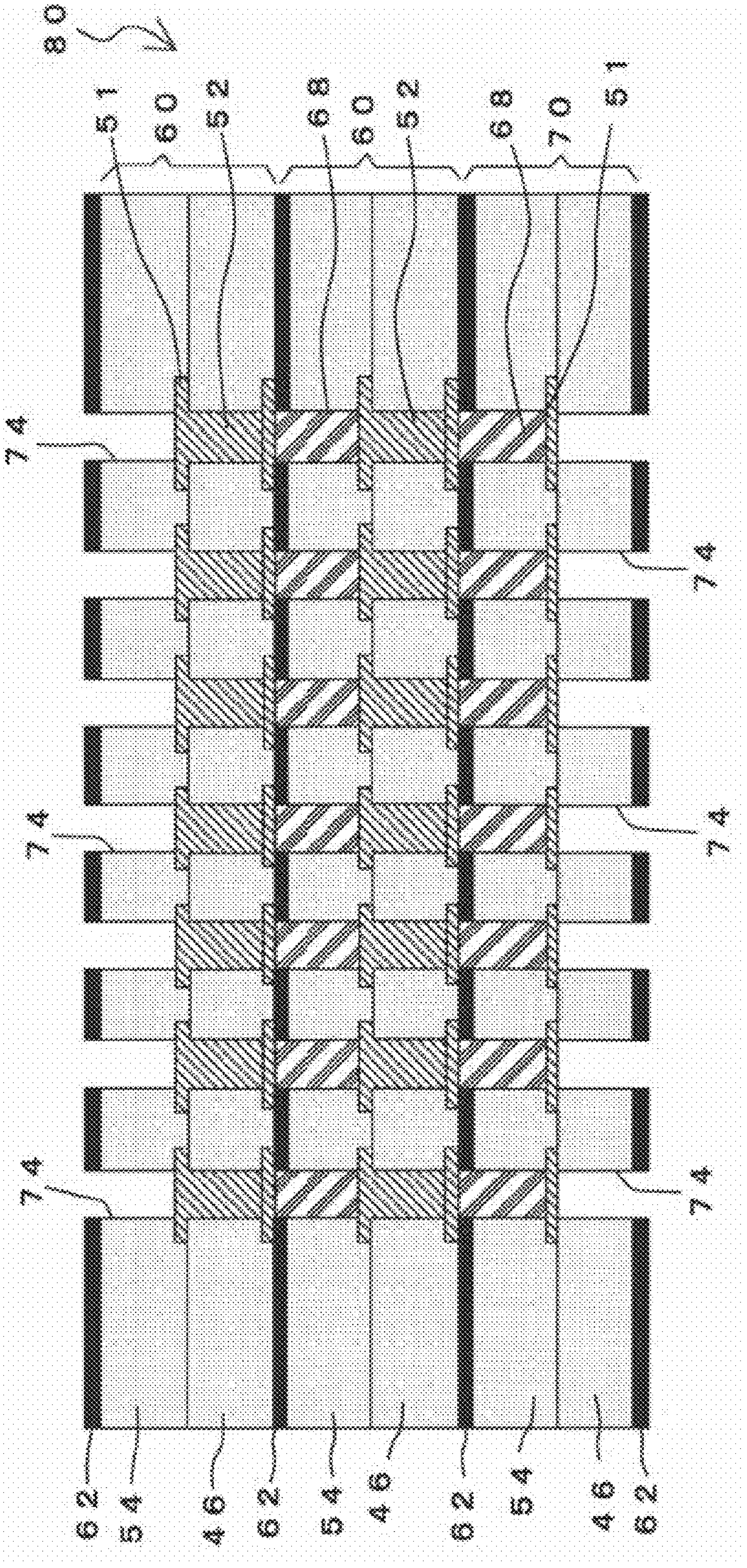
FIG. 22 is a schematic cross-sectional view (part 2) showing the example of the processing process of the completed laminated body.

As shown in FIG. 22, through holes 74 which reach the obverse surface of the metal layer 51 are formed in the insulating bonding layer 62 and the insulating layer 54 of the plated-via laminated body 60 in the obverse layer of the completed laminated body 80.

Similarly, the through holes 74 which reach the reverse surface of the metal layer 51 are formed in the insulating bonding layer 62 and the insulating layer 46 of the laminated body 70 in the reverse layer (the lower layer) of the completed laminated body 80.

The formation of the through holes 74 can be performed by laser processing. As the type of the laser when forming the through holes 74 with the laser, a $CO_2$ laser, a YAG laser, and so on can be cited, and can appropriately be selected. Further, the laser output is also not particularly limited, and can appropriately be selected.

Figure 23:
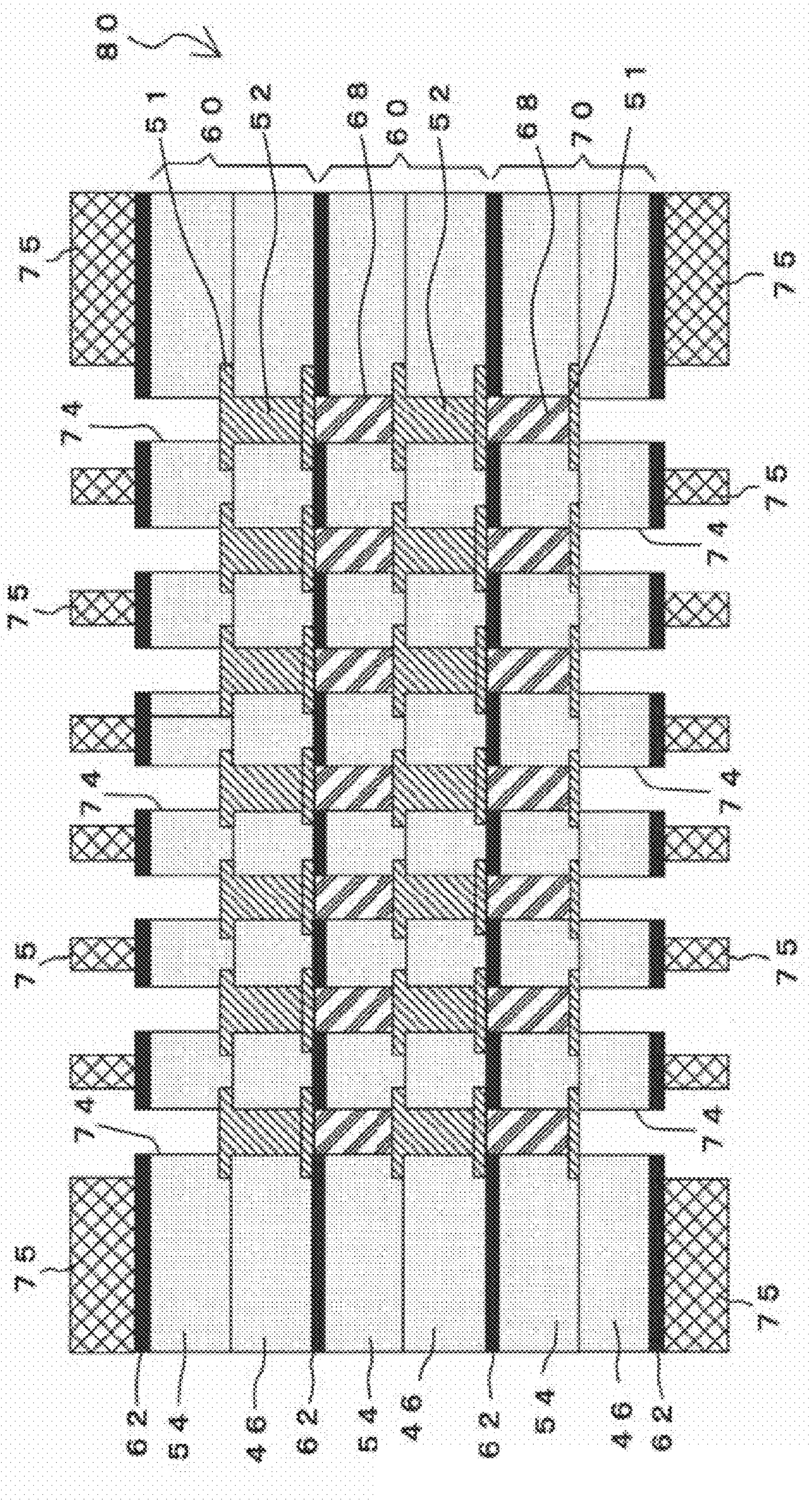
FIG. 23 is a schematic cross-sectional view (part 3) showing the example of the processing process of the completed laminated body.

As shown in FIG. 23, after forming the through holes 74 in the plated-via laminated body 60 in the obverse layer of the completed laminated body 80 and the laminated body 70 in the reverse layer, resist layers 75 are formed on the obverse surface and the reverse surface of the completed laminated body 80. As the resist layers 50, there can be used, for example, dry film resist (DFR) shaped like a film.

After attaching the dry film resist on surfaces of the insulating bonding layers 62 on the obverse surface and the reverse surface of the completed laminated body 80, exposure with a predetermined pattern is performed to remove unwanted parts, and thus, the resist layers 75 having predetermined patterns are obtained.

Figure 24:
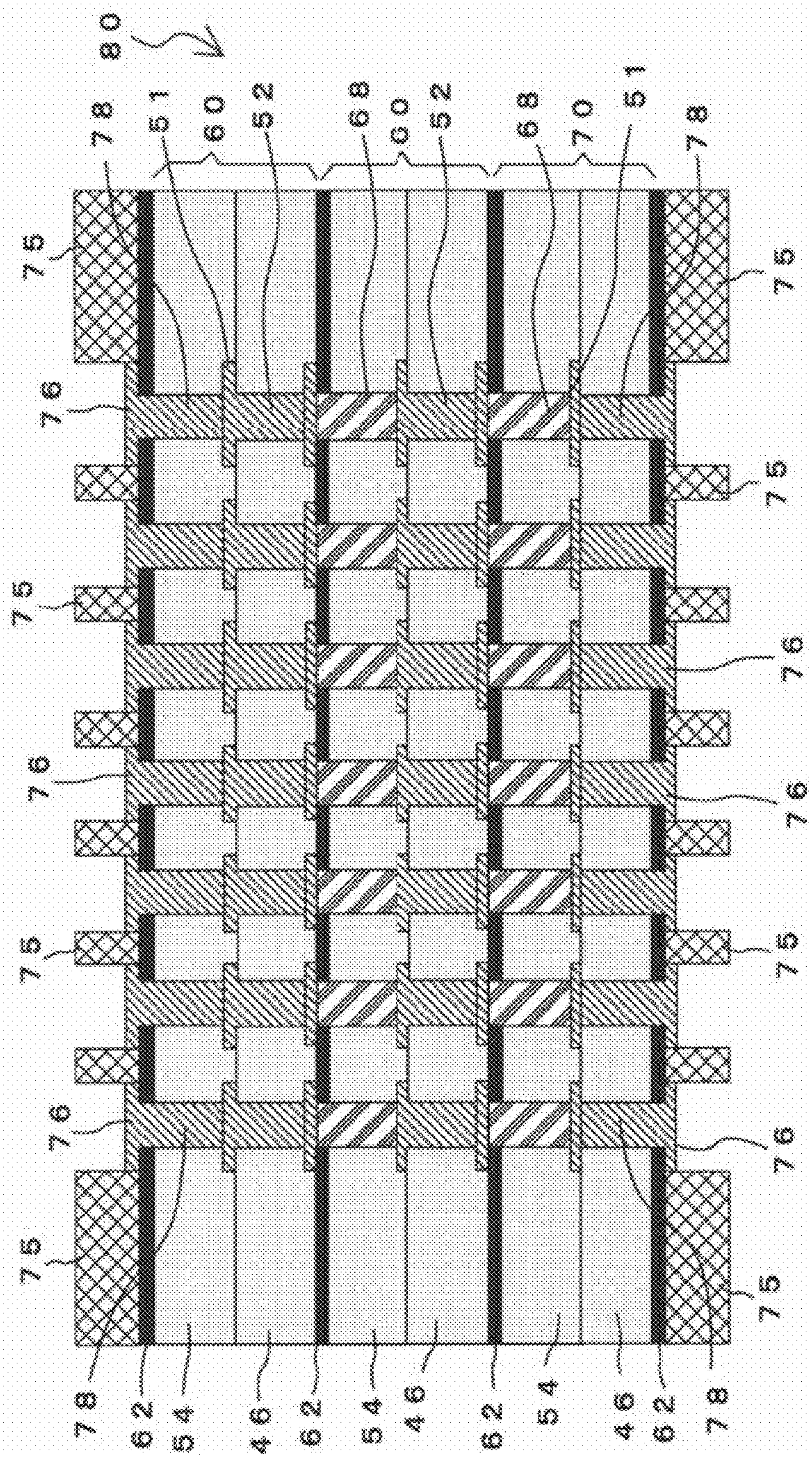
FIG. 24 is a schematic cross-sectional view (part 4) showing the example of the processing process of the completed laminated body.

Then, as shown in FIG. 24, plating is performed in places where the resist layers 75 having the predetermined patterns are not formed and the inside of the through holes 74 on the obverse surface and the reverse surface of the completed laminated body 80 on which the resist layers 75 are formed.

Thus, metal layers 76 which are patterned and plated vias 78 obtained by plating the through holes 74 are formed on both of the obverse surface and the reverse surface of the completed laminated body 80. Further, since the through holes 74 penetrate up to the surface of the metal layer 51 formed in advance, the plated vias 78 are formed so as to couple the metal layers 51 and the metal layers 76 to each other.

It should be noted that the plating can be performed using, for example, electrolytic copper plating, and in this case, the metal layers 76 and the plated vias 78 are formed of copper.

Figure 25:
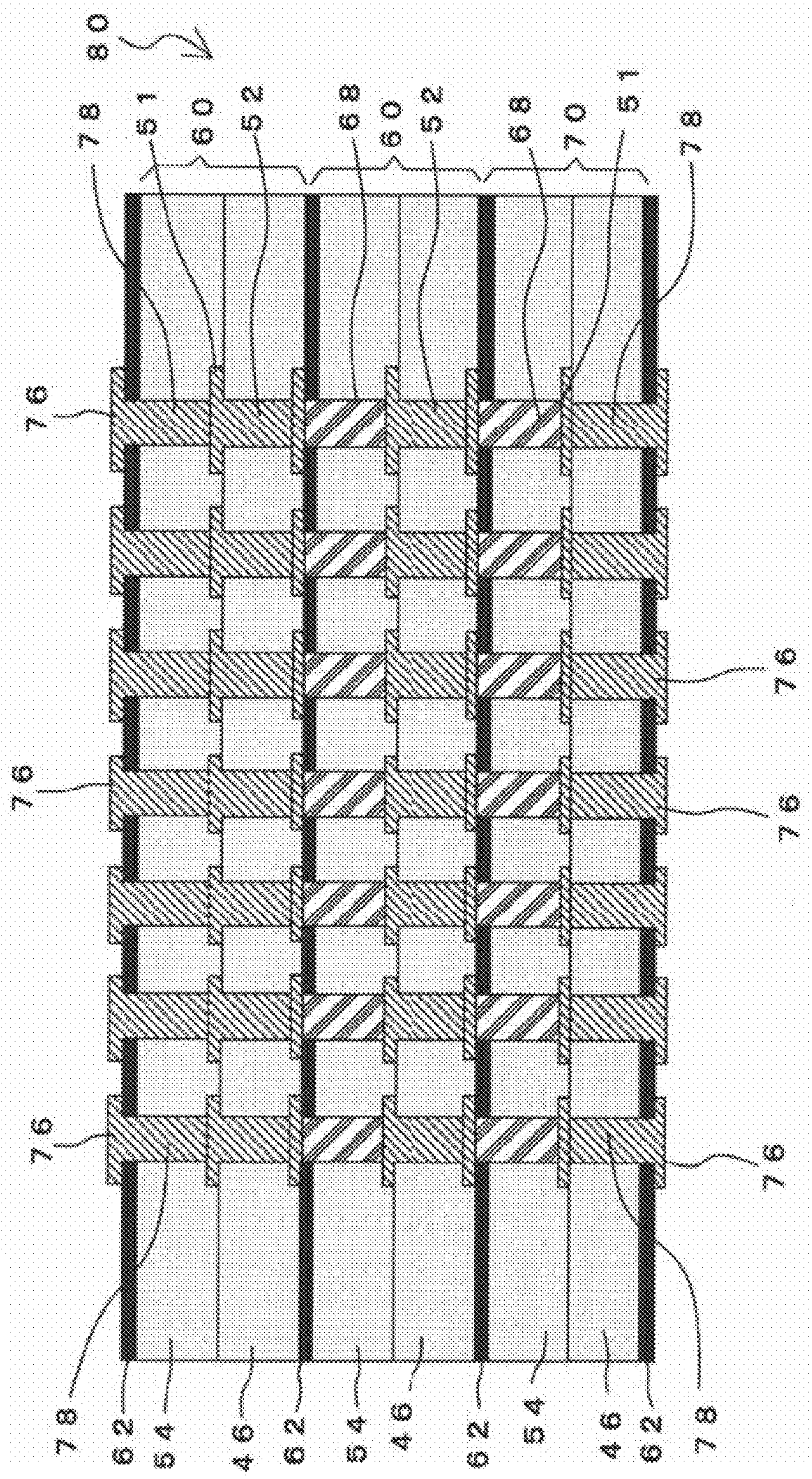
FIG. 25 is a schematic cross-sectional view (part 5) showing the example of the processing process of the completed laminated body.

Subsequently, as shown in FIG. 25, the resist layers 75 formed on the obverse surface and the reverse surface of the completed laminated body 80 are separated. By separating the resist layers 75, the completed laminated body 80 comes into the state in which the metal layers 76 which are patterned on the insulating bonding layers 62 are formed on the obverse surface and the reverse surface of the completed laminated body 80.

Figure 26:
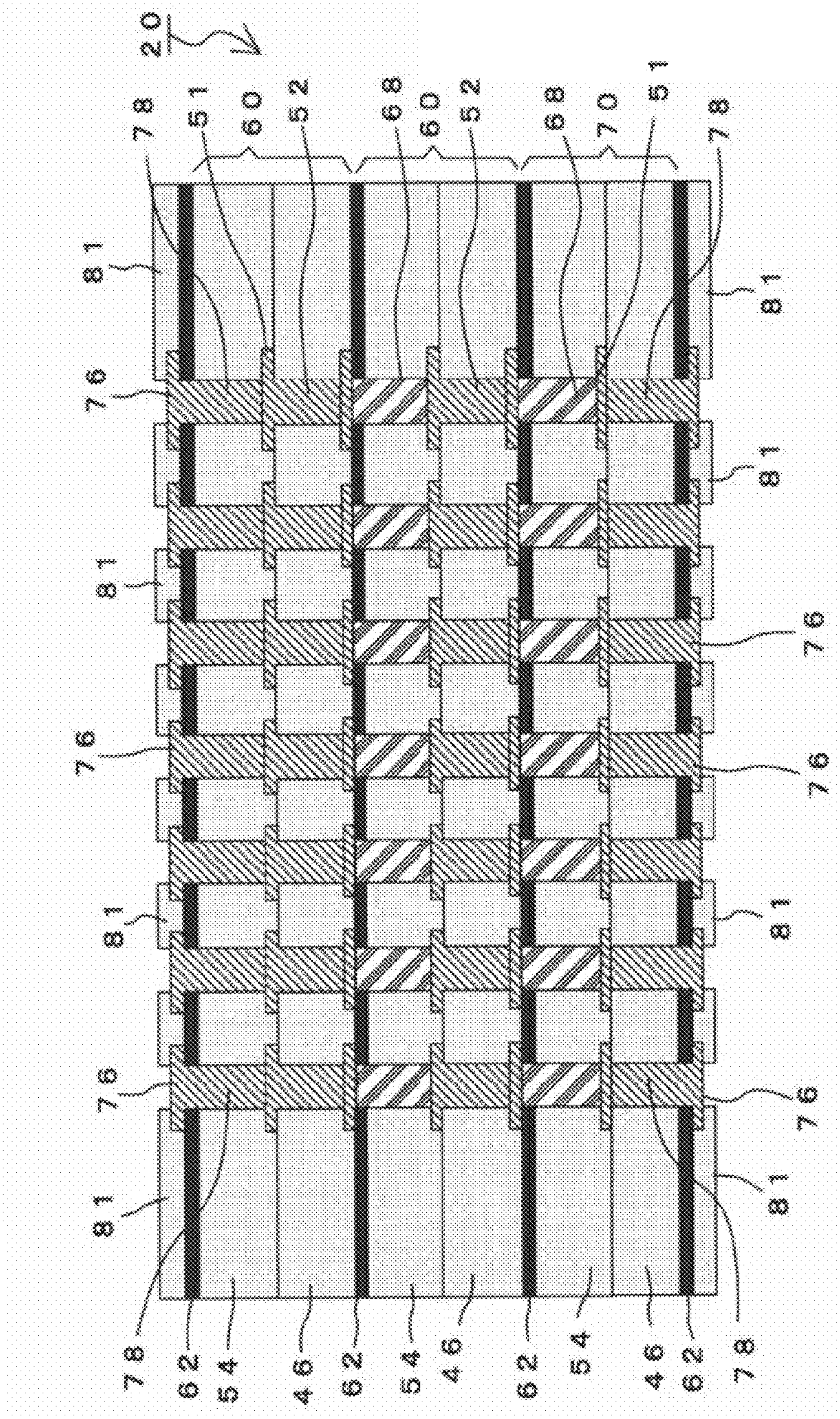
FIG. 26 is a schematic cross-sectional view showing a completed state of a multilayer substrate.

Then, as shown in FIG. 26, protective films 81 such as solder resist are formed so that only the metal layers 76 are exposed on the obverse surface and the reverse surface of the completed laminated body 80.

There can be cited a method for performing the formation of the protective film 81 with the solder resist by performing pattern printing of the solder resist on the obverse surface and the reverse surface of the completed laminated body 80 using screen printing or the like, and then hardening the solder resist with UV or thermal curing.

With this process, the multilayer substrate 20 is completed.

(Method for Manufacturing Laminated Body in Reverse Layer)

A method for manufacturing the laminated body in the reverse layer will hereinafter be described. It should be noted that since the number of layers of the whole of the completed laminated body 80 can be changed by changing the number of layers in the reverse layer, when the laminated body in the reverse layer consists of an odd number of layers and when it consists of an even number of layers are separately described. It should be noted that the number of layers mentioned here means the number of metal layers which can be formed. When the number of the insulating layers is, for example, two, the number of metal layers which can be formed becomes three, and therefore, the odd number of layers mentioned here are true, and when the number of the insulating layers is, for example, three, the number of metal layers which can be formed becomes four, and therefore, the even number of layers mentioned here are true.

(When Laminated Body in Reverse Layer Consists of Odd Number of Layers)

When manufacturing the laminated body with an odd number of layers in the reverse layer, first, the support body 38 is formed. The operations in FIG. 2 through FIG. 4 for forming the support body 38 are as described above, and are therefore omitted here.

Figure 27:
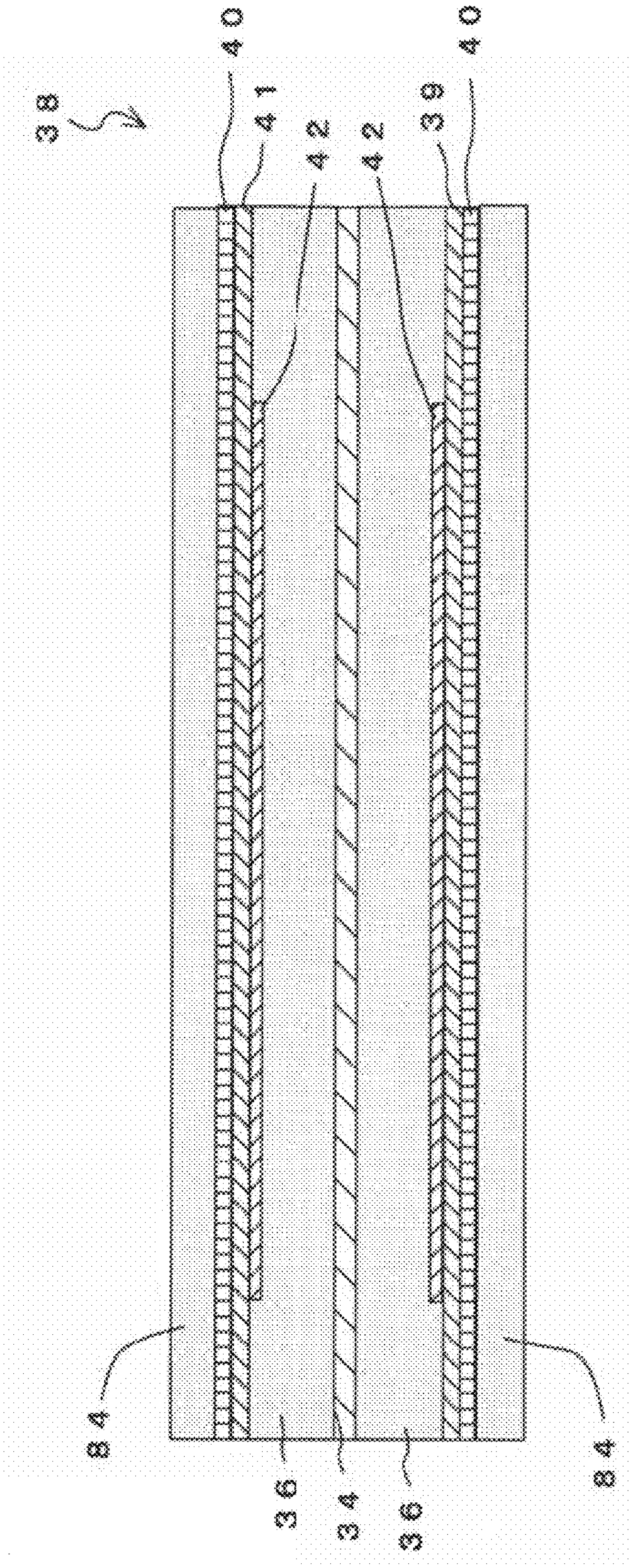
FIG. 27 is a schematic cross-sectional view (part 1) showing an example of a method for manufacturing a laminated body having an odd number of layers in a reverse layer.

In FIG. 27, there is shown when insulating layers 84 are formed on surfaces of the first metal layer 39 on an uppermost surface of the support body 38 and the first metal layer 39 on a lowermost surface of the support body 38 after the first metal layer 39 on the uppermost surface of the support body 38 shown in FIG. 4 and the first metal layer 39 on the lowermost surface of the support body 38 are separated.

As the insulating layers 84, there can be adopted, for example, thermosetting resin, and thermosetting insulating film can also be adopted.

Figure 28:
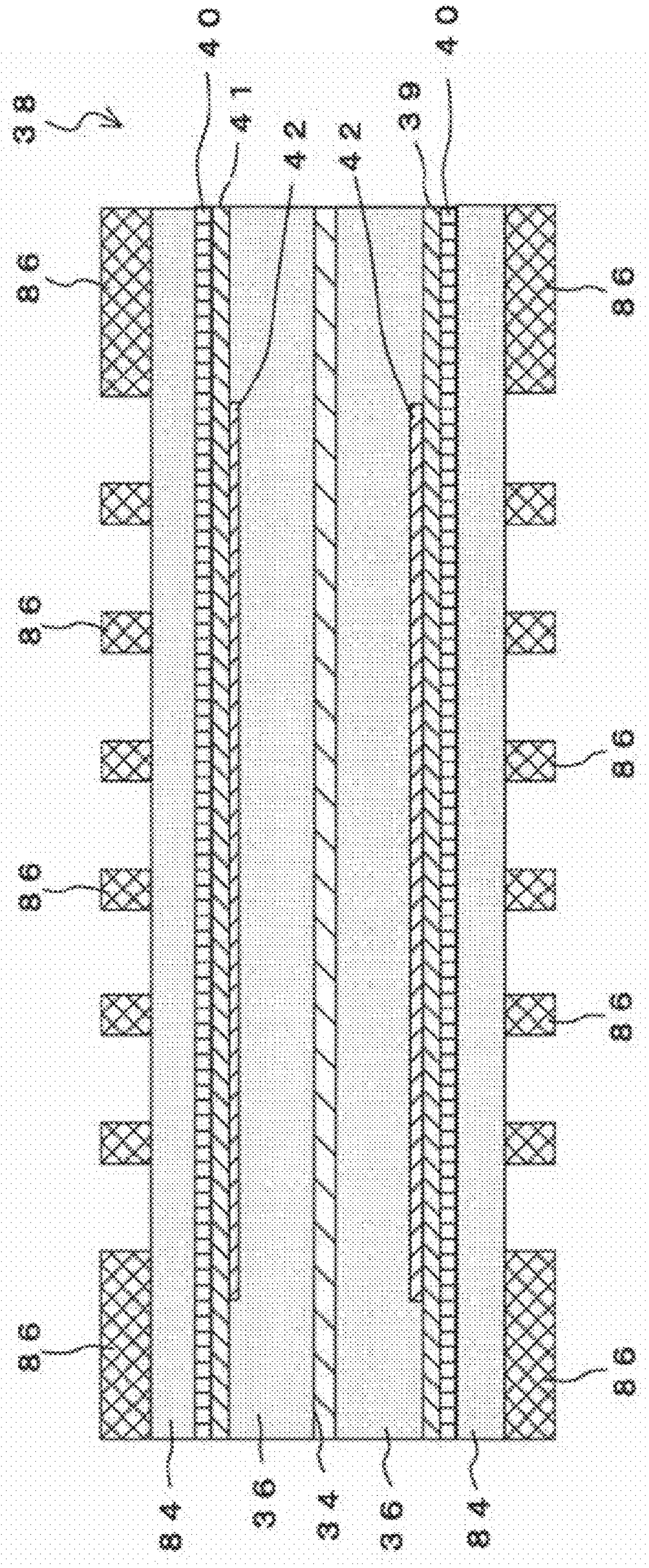
FIG. 28 is a schematic cross-sectional view (part 2) showing the example of the method for manufacturing the laminated body having the odd number of layers in the reverse layer.

Then, as shown in FIG. 28, resist layers 86 which are patterned are formed on surfaces of the insulating layers 84 on both of the upper and lower surfaces of the support body 38. As the resist layers 86, there can be used, for example, dry film resist (DFR) shaped like a film.

After attaching the dry film resist on the surfaces of the insulating layers 84, exposure with a predetermined pattern is performed to remove unwanted parts, and thus, the resist layers 86 having predetermined patterns are obtained.

Figure 29:
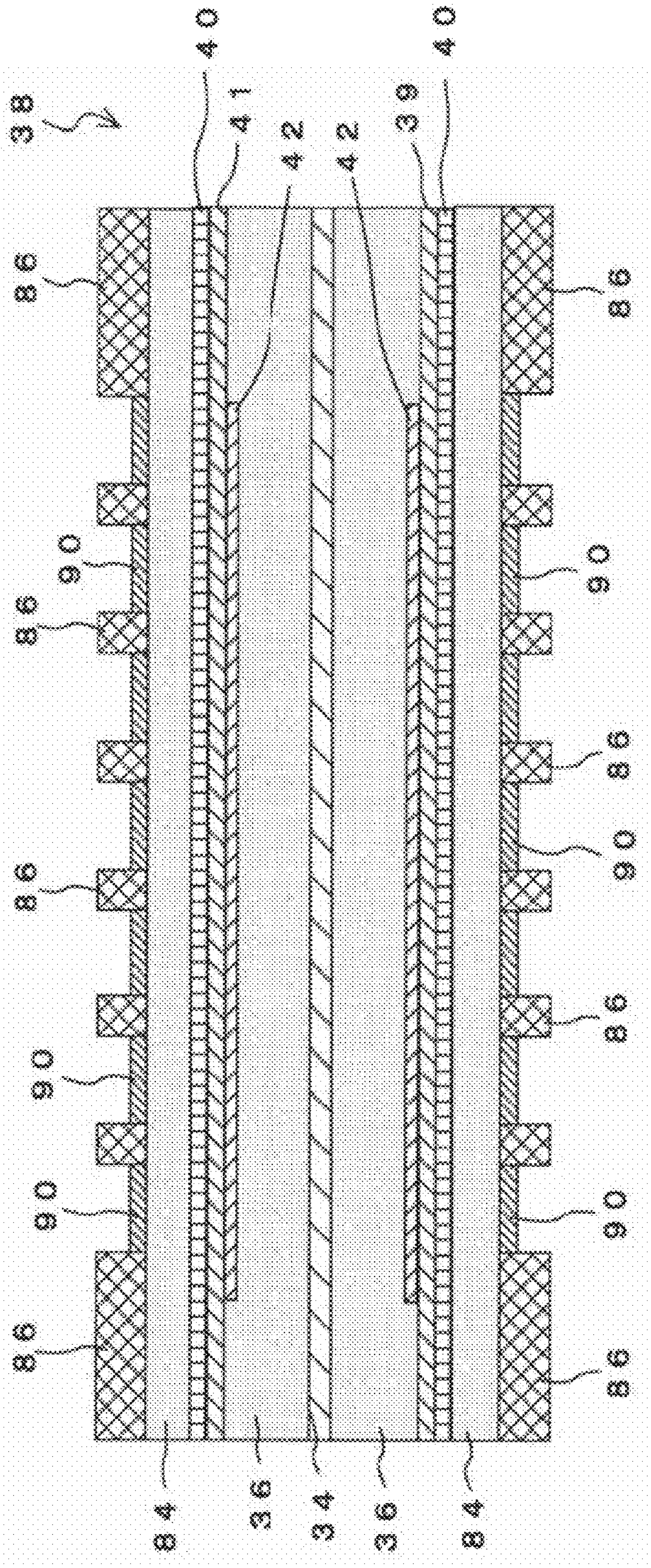
FIG. 29 is a schematic cross-sectional view (part 3) showing the example of the method for manufacturing the laminated body having the odd number of layers in the reverse layer.

Then, as shown in FIG. 29, plating is performed in places where the resist layers 86 having the predetermined patterns are not formed on both of the upper and lower surfaces of the support body 38. Thus, metal layers 90 are formed. It should be noted that the plating can be performed using, for example, electrolytic copper plating, and in this case, the metal layers 90 are formed of copper.

Figure 30:
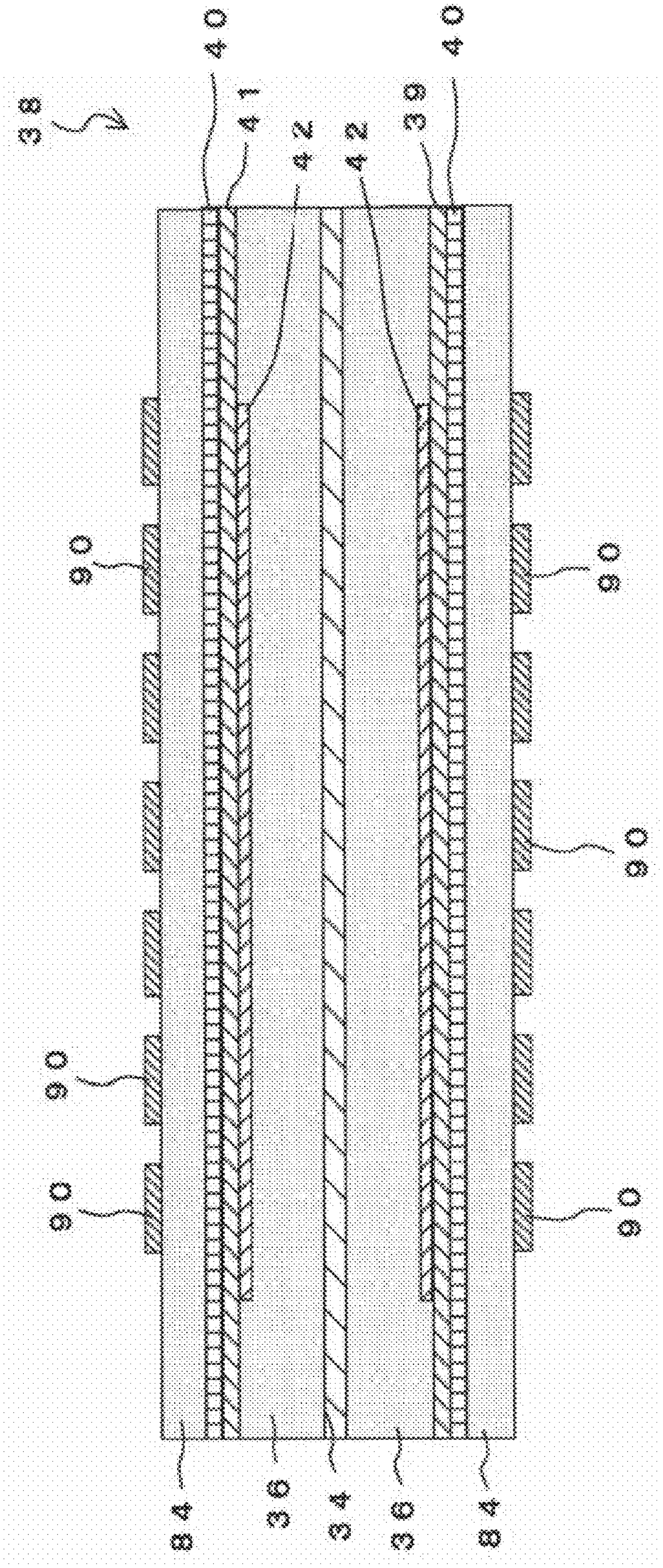
FIG. 30 is a schematic cross-sectional view (part 4) showing the example of the method for manufacturing the laminated body having the odd number of layers in the reverse layer.

Subsequently, as shown in FIG. 30, the resist layers 86 on both of the upper and lower surfaces of the support body 38 are separated. By separating the resist layers 86, the support body 38 comes into the state in which the metal layers 90 which are patterned on the insulating layers 84 are formed on both of the upper and lower surfaces of the support body 38.

Further, since insulating layers 92 are formed on surfaces of the metal layers 90 in the subsequent operation, it is possible to perform a roughening treatment on the surfaces of the metal layers 90 in the present operation to thereby enhance the adhesiveness between the metal layers 90 and the insulating layers 92.

Figure 31:
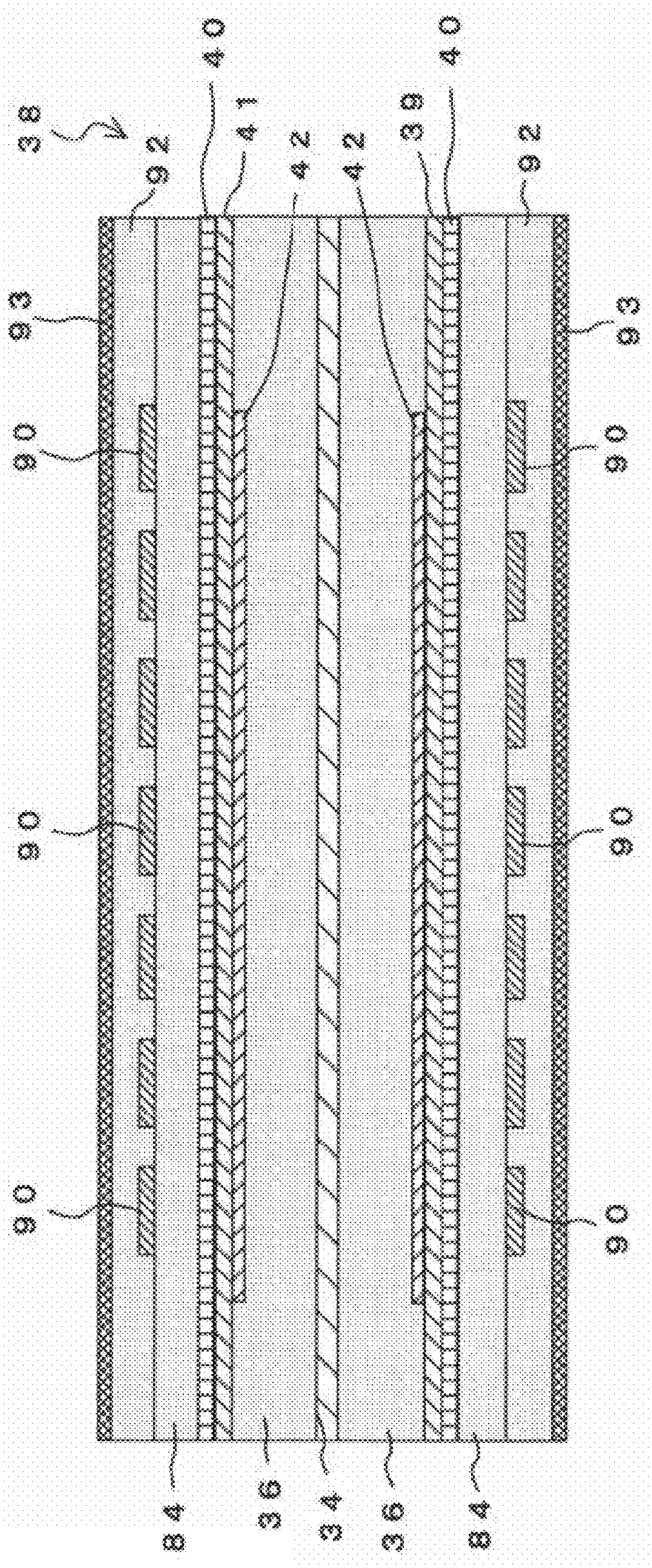
FIG. 31 is a schematic cross-sectional view (part 5) showing the example of the method for manufacturing the laminated body having the odd number of layers in the reverse layer.

Further, as shown in FIG. 31, the insulating layers 92 are formed on the insulating layers 84 and the surfaces of the metal layers 90 which are patterned on both of the upper and lower surfaces of the support body 38. As the insulating layers 92, there can be adopted, for example, thermosetting resin, and thermosetting insulating film can also be adopted.

Further, resin films 93 for protection are attached to surfaces of the insulating layers 92 on both of the upper and lower surfaces of the support body 38. Any objects can be adopted as the resin film 93, but it is possible to use, for example, a PET film.

Then, the support body 38 is separated to obtain two laminated bodies 70 with an odd number of layers in the reverse layers. Since the two layers of the insulating layer 84 and the insulating layer 92 are formed and then separated as in the present embodiment, it is possible to keep the strength to prevent breakage and so on compared to when separating a single layer.

Figure 32:
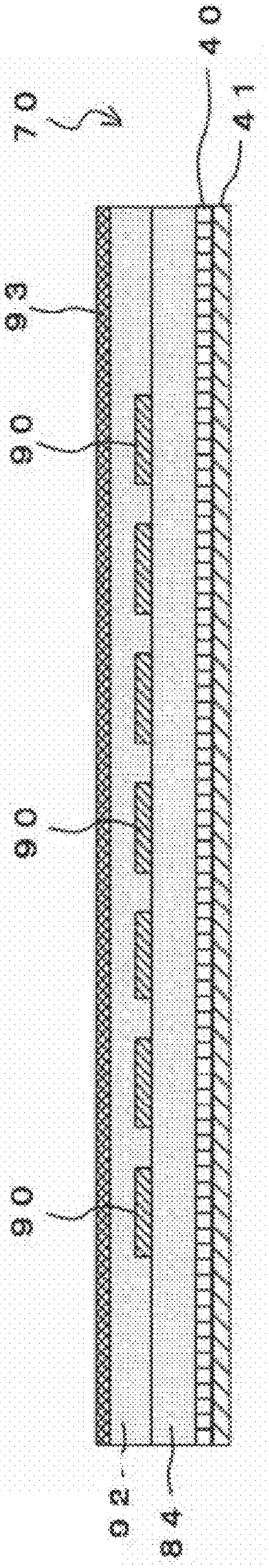
FIG. 32 is a schematic cross-sectional view (part 6) showing the example of the method for manufacturing the laminated body having the odd number of layers in the reverse layer.

The laminated body 70 with an odd number of layers in the reverse layer obtained by the separation is shown in FIG. 32.

Due to the separation of the support body 38, the base member 34 shaped like a plate, the bonding layer 36, and the metal layer 42 narrow in width become unnecessary. It should be noted that when performing the separation, processing of cutting an outside portion of the support body 38 along the lamination direction is performed, but the illustration thereof is omitted here.

The second metal layer 40 made of nickel and the third metal layer 41 made of copper are still disposed on a lower surface of the laminated body 70 with an odd number of layers in the reverse layer.

Figure 33:
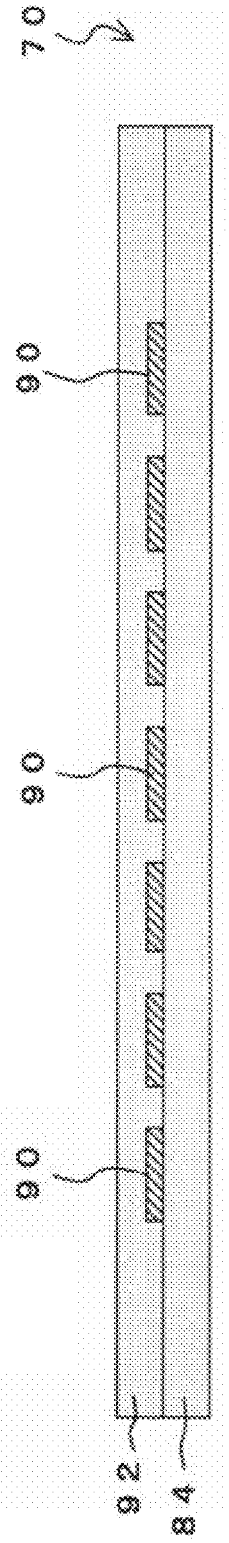
FIG. 33 is a schematic cross-sectional view (part 7) showing the example of the method for manufacturing the laminated body having the odd number of layers in the reverse layer.

Then, as shown in FIG. 33, the resin film 93 for protecting the laminated body 70 with an odd number of layers in the reverse layer separated from the support body 38 is separated, and further, the third metal layer 41 and the second metal layer 40 are separated. The separation of the third metal layer 41 and the second metal layer 40 is performed by etching.

Figure 34:
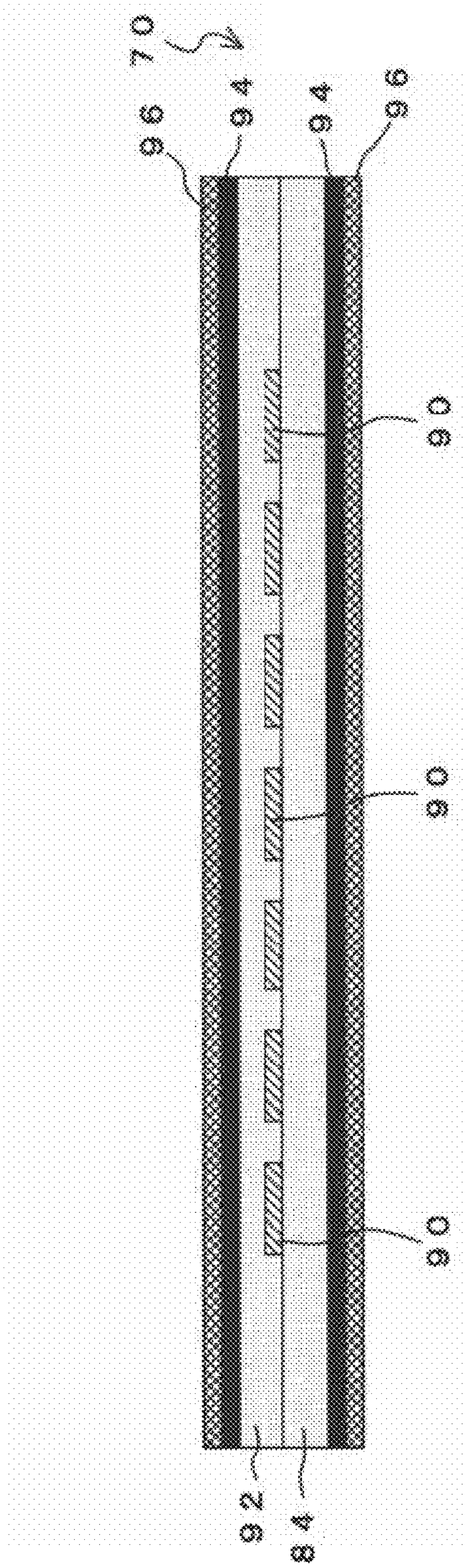
FIG. 34 is a schematic cross-sectional view (part 8) showing the example of the method for manufacturing the laminated body having the odd number of layers in the reverse layer.

As shown in FIG. 34, insulating bonding layers 94 are formed on both of the obverse surface and the reverse surface of the laminated body 70 with an odd number of layers in the reverse layer. As the insulating bonding layer 94, it is also possible to adopt a bonding sheet obtained by laminating an adhesive and a separator.

Further, a resin film 96 is attached to a surface of each of the insulating bonding layers 94. Any objects can be adopted as the resin film 96, and it is possible to use, for example, a PET film.

Figure 35:
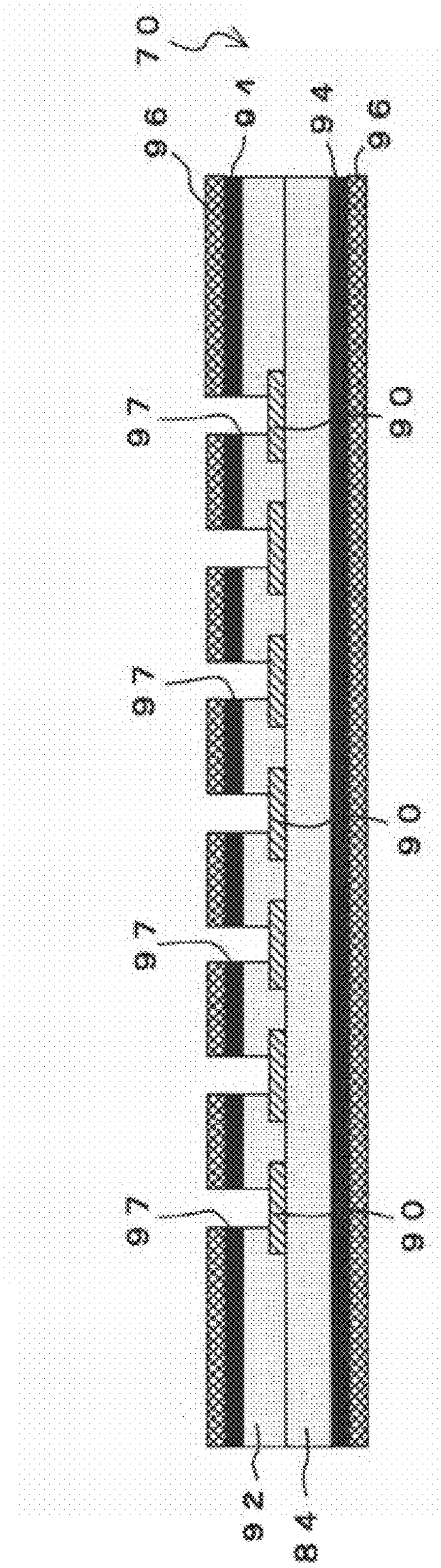
FIG. 35 is a schematic cross-sectional view (part 9) showing the example of the method for manufacturing the laminated body having the odd number of layers in the reverse layer.

Then, as shown in FIG. 35, through holes 97 which penetrate the resin film 96, the insulating bonding layer 94, and the insulating layer 92 to reach the surface of the metal layer 90 are formed. The formation of the through holes 97 can be performed by laser processing. As the type of the laser when forming the through holes 97 with the laser, a $CO_2$ laser, a YAG laser, and so on can be cited, and can appropriately be selected.

Further, the laser output is also not particularly limited, and can appropriately be selected.

Figure 36:
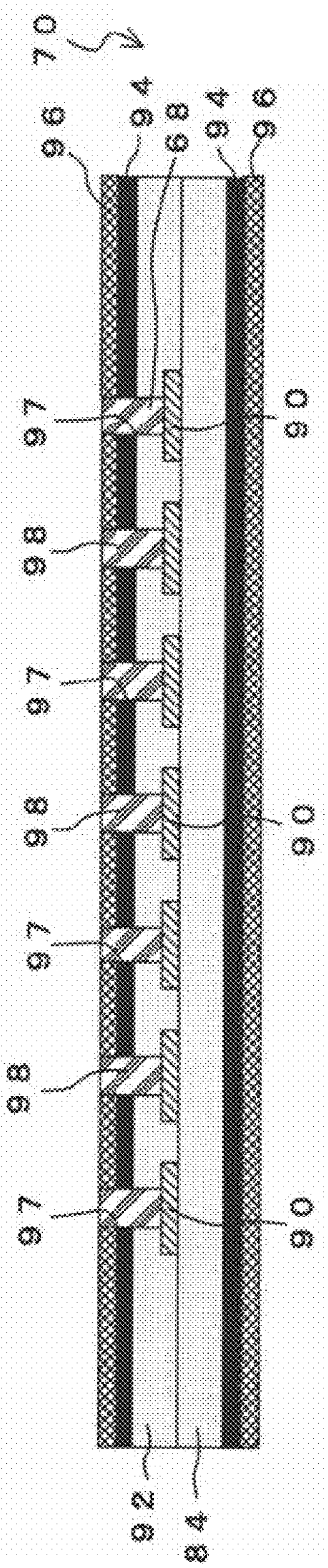
FIG. 36 is a schematic cross-sectional view showing a completed state of the laminated body having the odd number of layers in the reverse layer.

Subsequently, as shown in FIG. 36, the through holes 97 are filled with a conductive paste 98. By filling the through holes 97 with the conductive paste 98, the paste vias 68 are formed.

As the conductive paste 98, it is possible to adopt what includes a conductive filler and binder resin.

As the conductive filler, it is possible to cite metal particles made of, for example, copper, gold, silver, palladium, nickel, tin, or bismuth. These metal particles can be used as a single type, or a mixture of two or more types.

As the binder resin, it is possible to adopt, for example, epoxy resin as a type of thermosetting resin. It should be noted that the epoxy resin is not a limitation, and it is possible to adopt polyimide resin or the like. Further, as the binder resin, it is possible to adopt thermoplastic resin instead of the thermosetting resin.

Further, by separating the resin film 96, the laminated body 70 in the reverse layer shown in FIG. 18 is formed.

The laminated body 70 manufactured in the process described above is of an odd-number layer type in which the number of metal layers is odd, and specifically has just one metal layer. Therefore, this laminated body 70 is not provided with the plated via, and is therefore referred to simply as the laminated body 70.

It should be noted that when manufacturing an even-number layer type in which the number of metal layers is even, it is necessary to adopt the following process.

(When Laminated Body in Reverse Layer Consists of Even Number of Layers)

When manufacturing the laminated body with an even number of layers in the reverse layer, the operations in FIG. 2 through FIG. 4 for forming the support body 38 are as described above, and further, the operations in FIG. 27 trough FIG. 31 out of the process of manufacturing the laminated body with an odd number of layers described above are the same operations, and the laminated body with an even number of layers is manufactured from the support body shown in FIG. 31 with another process.

Therefore, here, the description of the operations in FIG. 2 through FIG. 4, and the operations in FIG. 27 through FIG. 31 are omitted.

It should be noted that when manufacturing the laminated body with an even number of layers, it is assumed that the resin films 93 are not formed on surfaces of the insulating layers 92 in the state in which the insulating layers 92 are disposed on both of the upper and lower surfaces of the support body 38 in FIG. 31.

Figure 37:
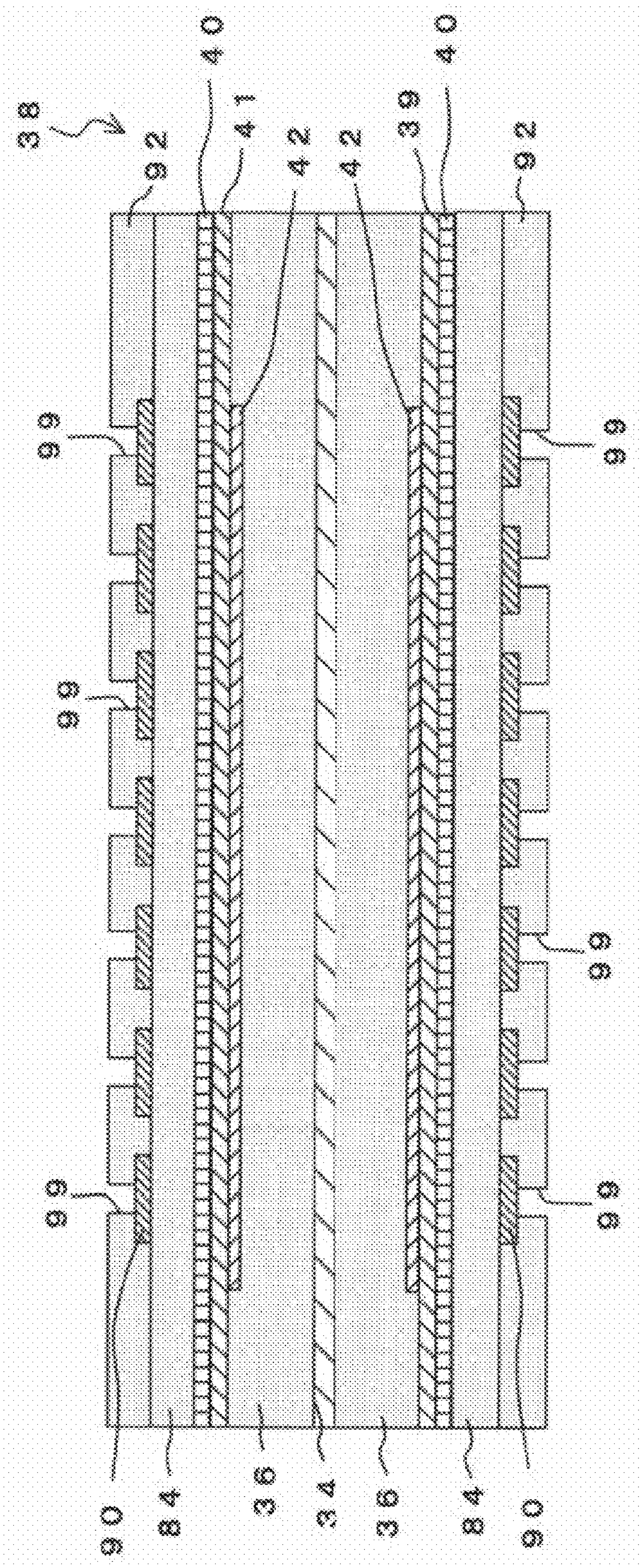
FIG. 37 is a schematic cross-sectional view (part 1) showing an example of a method for manufacturing a laminated body having an even number of layers in the reverse layer.

As shown in FIG. 37, in the state in which the insulating layers 92 are disposed on both of the upper and lower surfaces of the support body 38 shown in FIG. 31, through holes 99 which reach the surface of the metal layer 90 from the insulating layer 92 on both of the upper and lower surfaces of the support body 38 are formed with respect to the support body 38 in which the resin films 93 are not to be formed on the surfaces of the insulating layers 92. The formation of the through holes 99 can be performed by laser processing. As the type of the laser when forming the through holes 99 with the laser, a $CO_2$ laser, a YAG laser, and so on can be cited, and can appropriately be selected. Further, the laser output is also not particularly limited, and can appropriately be selected.

Figure 38:
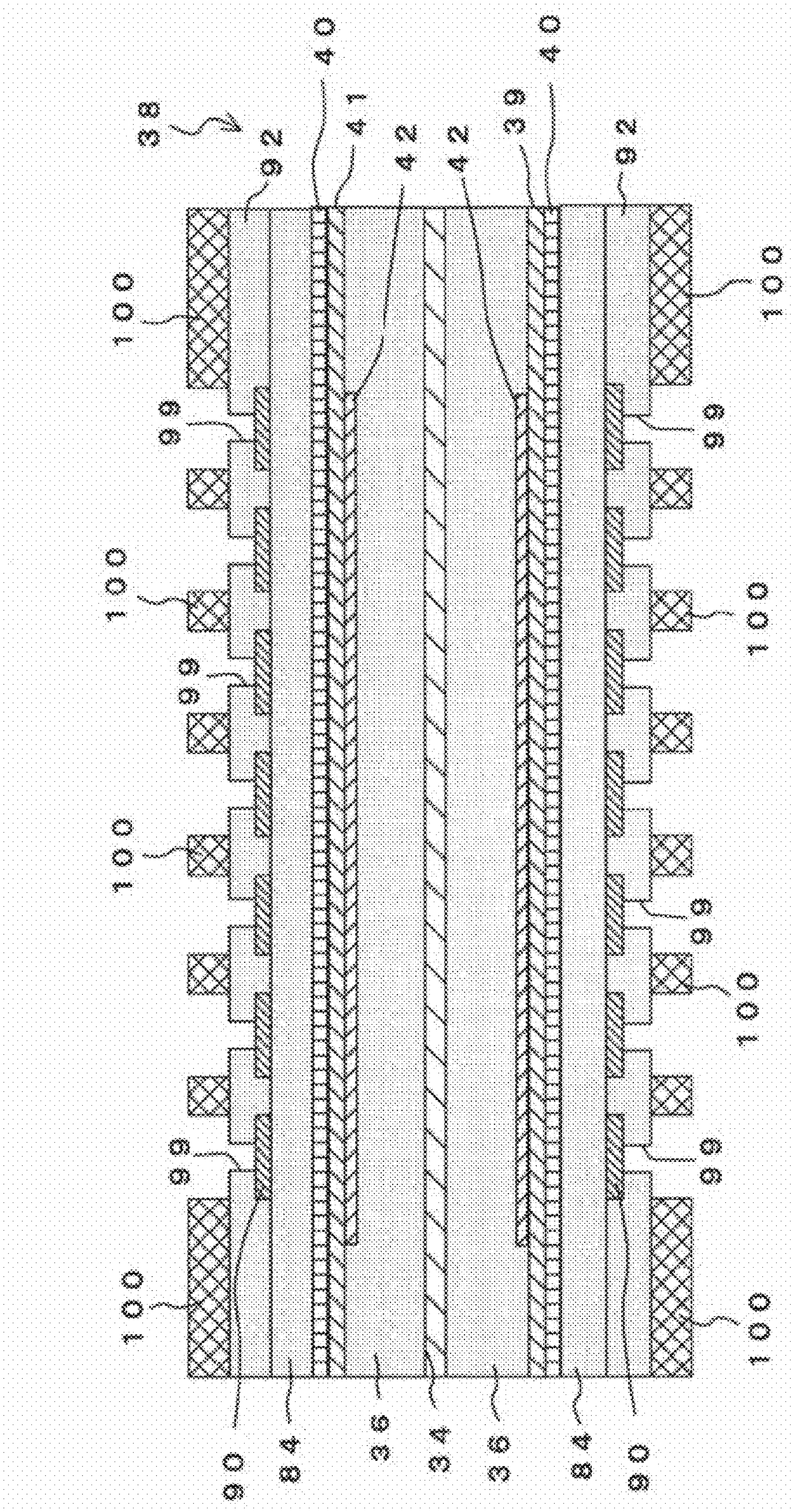
FIG. 38 is a schematic cross-sectional view (part 2) showing the example of the method for manufacturing the laminated body having the even number of layers in the reverse layer.

Then, as shown in FIG. 38, after the through holes 99 are provided to both of the upper and lower surfaces of the support body 38, resist layers 100 are formed on both of the upper and lower surfaces of the support body 38. As the resist layers 100, there can be used, for example, dry film resist (DFR) shaped like a film.

After attaching the dry film resist on the surfaces of the insulating layers 92 on both of the upper and lower surfaces of the support body 38, exposure with a predetermined pattern is performed to remove unwanted parts, and thus, the resist layers 100 having predetermined patterns are obtained.

Figure 39:
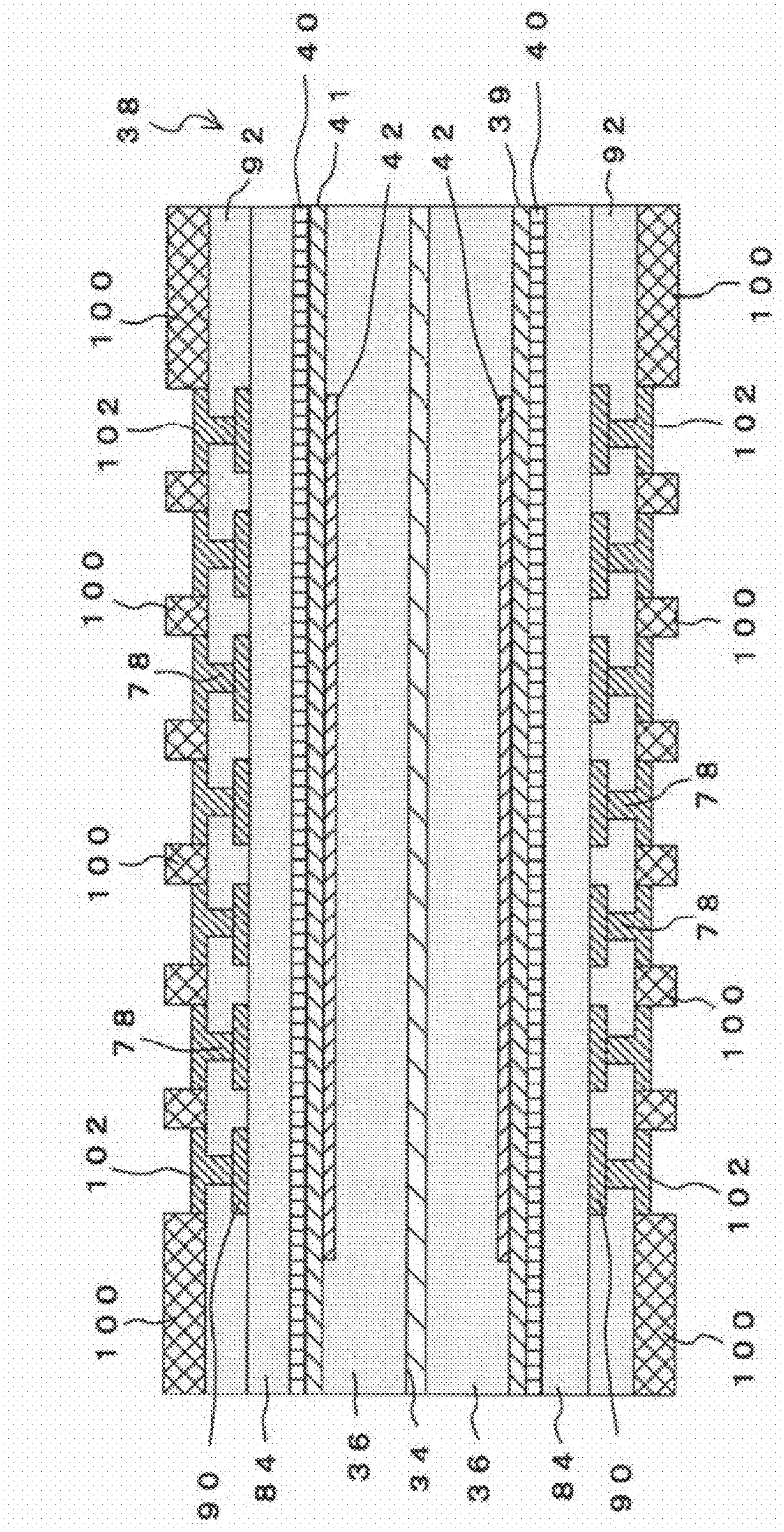
FIG. 39 is a schematic cross-sectional view (part 3) showing the example of the method for manufacturing the laminated body having the even number of layers in the reverse layer.

Then, as shown in FIG. 39, plating is performed in places where the resist layers 100 having the predetermined patterns are not formed and the inside of the through holes 99 on both of the upper and lower surfaces of the support body 38.

Thus, metal layers 102 which are patterned and the plated vias 78 obtained by plating the through holes 99 are formed on both of the obverse surface and the reverse surface of the support body 38. Further, since the through holes 99 penetrate up to the surface of the metal layer 90 formed in advance, the plated vias 78 are formed so as to couple the metal layers 90 and the metal layers 102 to each other.

It should be noted that the plating can be performed using, for example, electrolytic copper plating, and in this case, the metal layers 102 and the plated vias 78 are formed of copper.

Figure 40:
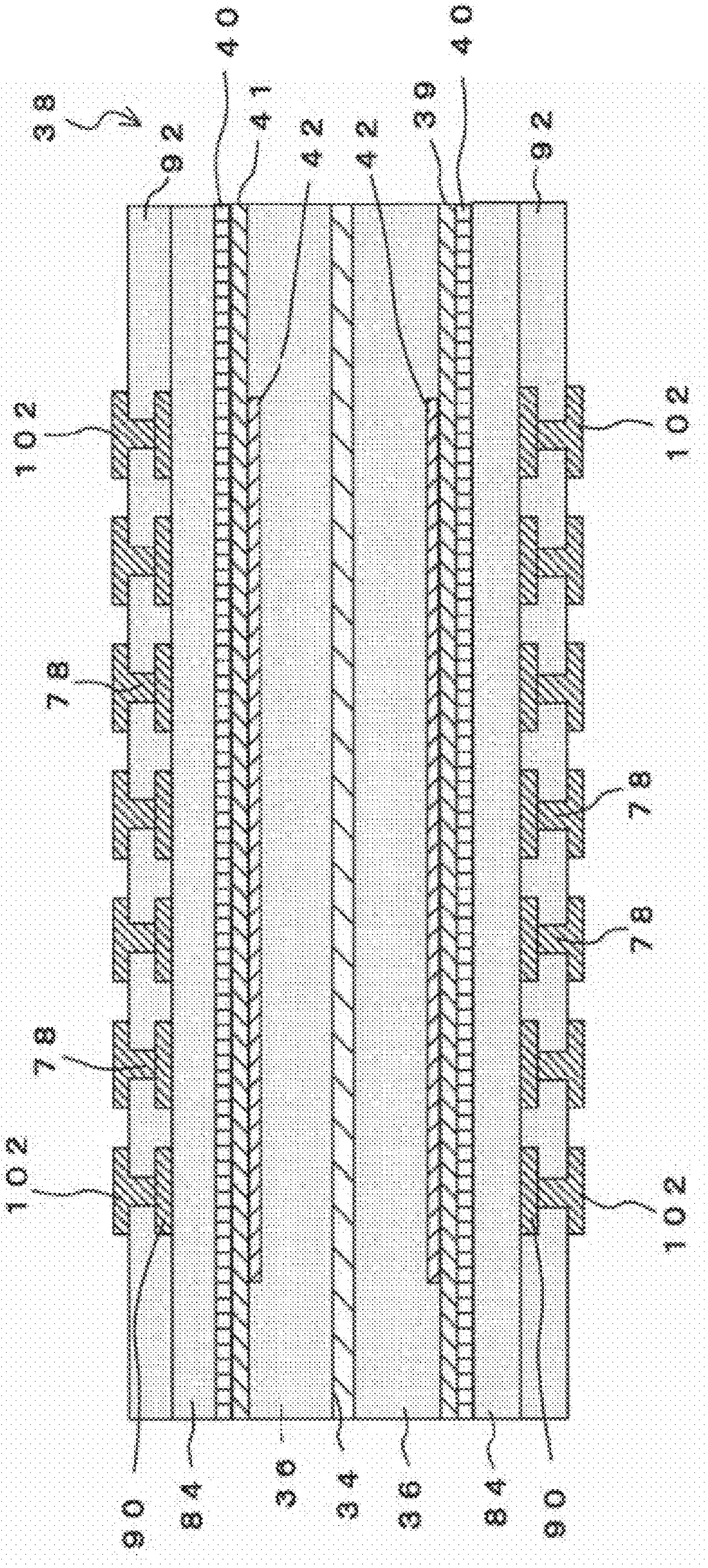
FIG. 40 is a schematic cross-sectional view (part 4) showing the example of the method for manufacturing the laminated body having the even number of layers in the reverse layer.

Subsequently, as shown in FIG. 40, the resist layers 100 on both of the upper and lower surfaces of the support body 38 are separated. By separating the resist layers 100, the support body 38 comes into the state in which the metal layers 102 which are patterned on the insulating layers 92 are formed on both of the upper and lower surfaces of the support body 38.

Further, since insulating layers 104 are formed on surfaces of the metal layers 102 in the subsequent operation, it is possible to perform a roughening treatment on the surfaces of the metal layers 102 in the present operation to thereby enhance the adhesiveness between the metal layers 102 and the insulating layers 104.

Figure 41:
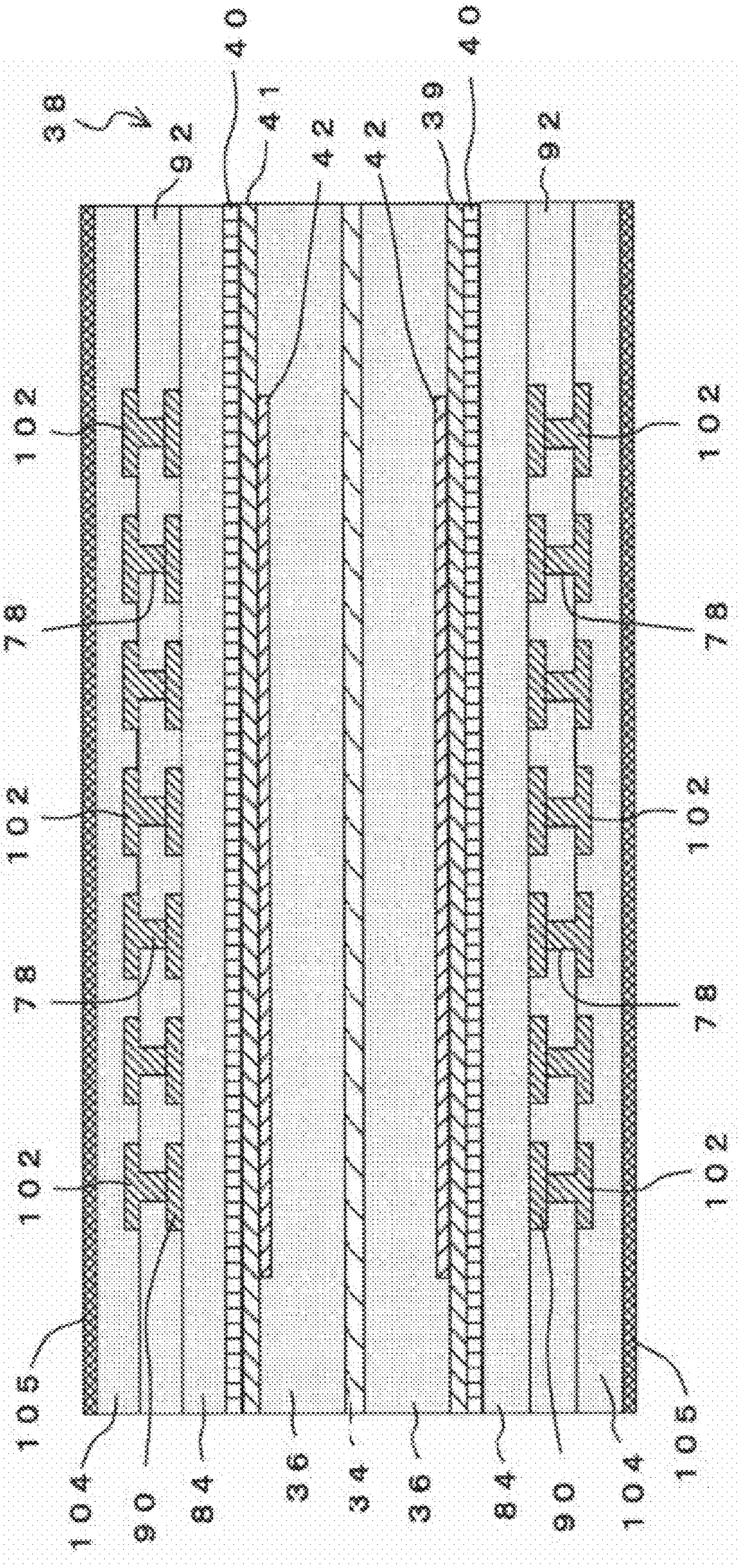
FIG. 41 is a schematic cross-sectional view (part 5) showing the example of the method for manufacturing the laminated body having the even number of layers in the reverse layer.

As shown in FIG. 41, the insulating layers 104 are formed on the insulating layers 92 and the surfaces of the metal layers 102 which are patterned on both of the upper and lower surfaces of the support body 38. As the insulating layers 104, there can be adopted, for example, thermosetting resin, and thermosetting insulating film can also be adopted.

Further, resin films 105 for protection are attached to the surfaces of the insulating layers 92 on both of the upper and lower surfaces of the support body 38. Any objects can be adopted as the resin film 105, and it is possible to use, for example, a PET film.

Figure 42:
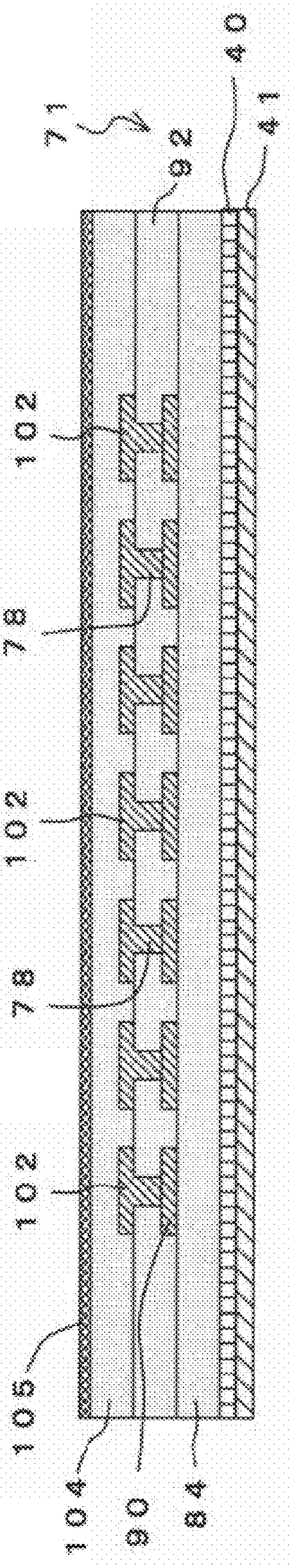
FIG. 42 is a schematic cross-sectional view (part 6) showing the example of the method for manufacturing the laminated body having the even number of layers in the reverse layer.

Then, the support body 38 is separated to obtain two laminated bodies 71 with an even number of layers in the reverse layers. The laminated body 71 with an even number of layers in the reverse layer obtained by the separation is shown in FIG. 42.

Due to the separation of the support body 38, the base member 34 shaped like a plate, the bonding layer 36, and the metal layer 42 narrow in width become unnecessary. It should be noted that when performing the separation, processing of cutting an outside portion of the support body 38 along the lamination direction is performed, but the illustration thereof is omitted here.

The second metal layer 40 made of nickel and the third metal layer 41 made of copper are still disposed on a lower surface of the laminated body 71 with an even number of layers in the reverse layer.

Figure 43:
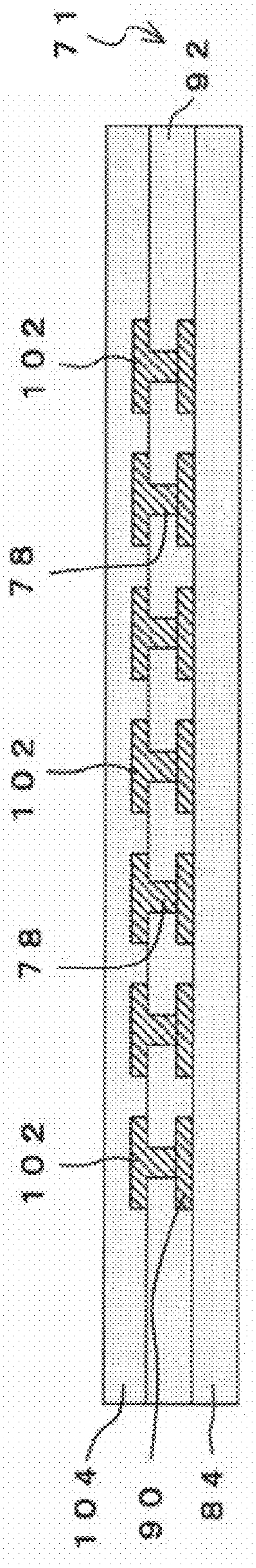
FIG. 43 is a schematic cross-sectional view (part 7) showing the example of the method for manufacturing the laminated body having the even number of layers in the reverse layer.

Then, as shown in FIG. 43, the resin film 105 for protecting the laminated body 71 with an even number of layers in the reverse layer separated from the support body 38 is separated, and further, the third metal layer 41 and the second metal layer 40 are separated.

The separation of the third metal layer 41 and the second metal layer 40 is performed by etching.

Figure 44:
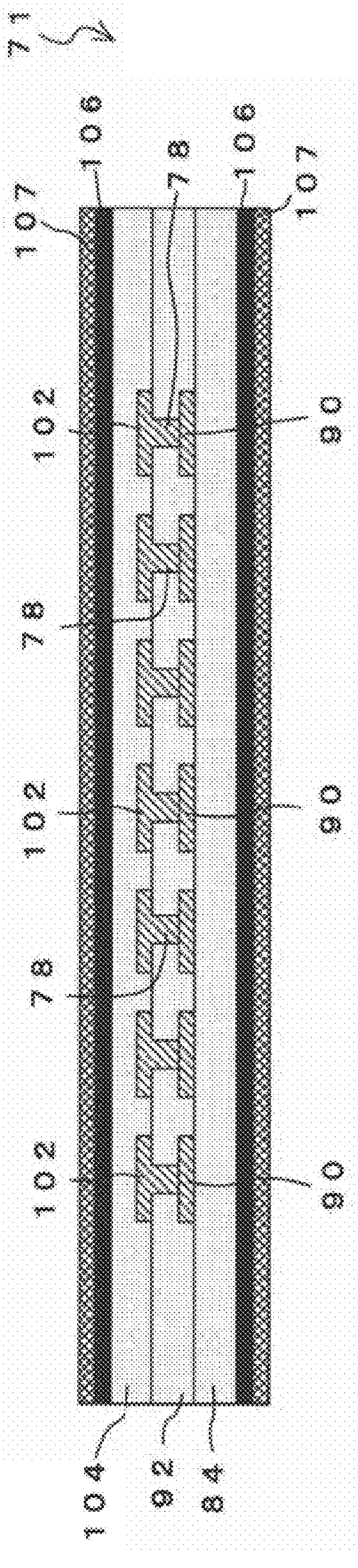
FIG. 44 is a schematic cross-sectional view (part 8) showing the example of the method for manufacturing the laminated body having the even number of layers in the reverse layer.

Then, as shown in FIG. 44, insulating bonding layers 106 are formed on both of an obverse surface and a reverse surface of the laminated body 71 with an even number of layers in the reverse layer. As the insulating bonding layer 106, it is also possible to adopt a bonding sheet obtained by laminating an adhesive and a separator.

Further, a resin film 107 is attached to an upper surface of each of the insulating bonding layers 106. Any objects can be adopted as the resin film 107, and it is possible to use, for example, a PET film.

Figure 45:
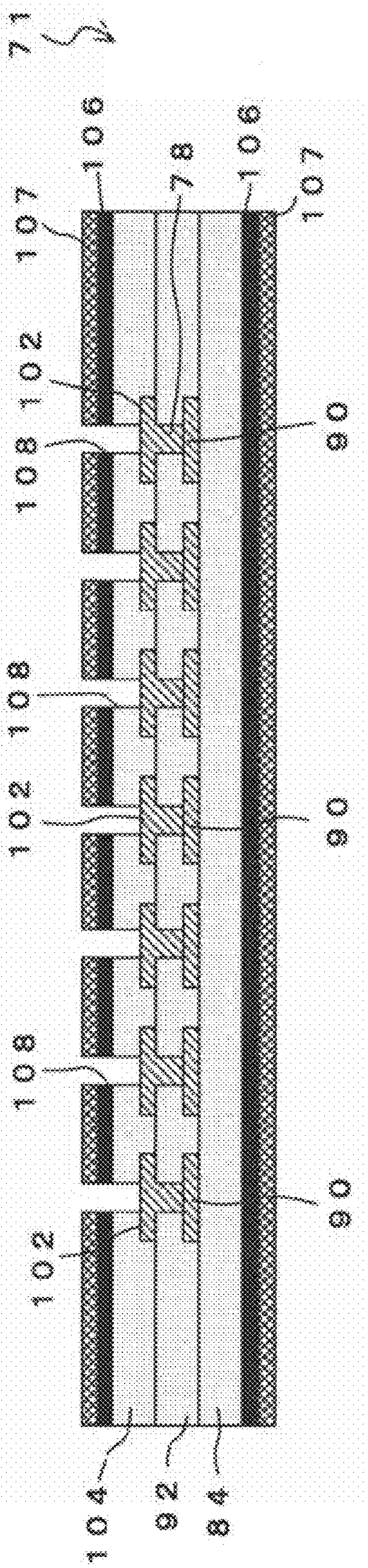
FIG. 45 is a schematic cross-sectional view (part 9) showing the example of the method for manufacturing the laminated body having the even number of layers in the reverse layer.

Then, as shown in FIG. 45, through holes 108 which penetrate the resin film 107, the insulating bonding layer 106, and the insulating layer 104 to reach the surface of the metal layer 102 are formed. The formation of the through holes 108 can be performed by laser processing. As the type of the laser when forming the through holes 108 with the laser, a $CO_2$ laser, a YAG laser, and so on can be cited, and can appropriately be selected. Further, the laser output is also not particularly limited, and can appropriately be selected.

Figure 46:
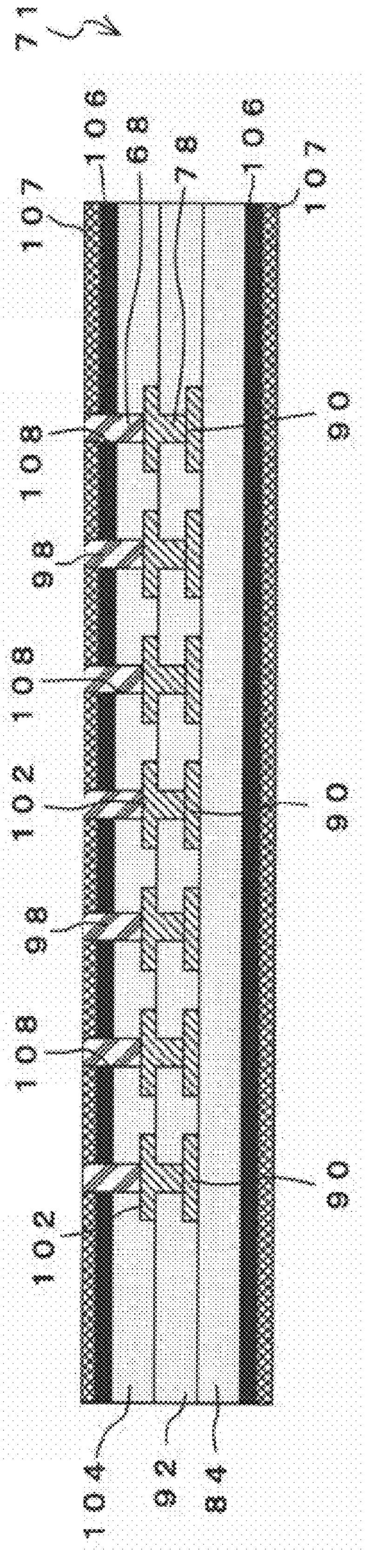
FIG. 46 is a schematic cross-sectional view showing a completed state of the laminated body having the even number of layers in the reverse layer.

Subsequently, as shown in FIG. 46, the through holes 108 are filled with the conductive paste 98. By filling the through holes 108 with the conductive paste 98, the paste vias 68 are formed.

As the conductive paste 98, it is possible to adopt what includes a conductive filler and binder resin.

As the conductive filler, it is possible to cite metal particles made of, for example, copper, gold, silver, palladium, nickel, tin, or bismuth. These metal particles can be used as a single type, or a mixture of two or more types.

As the binder resin, it is possible to adopt, for example, epoxy resin as a type of thermosetting resin. It should be noted that the epoxy resin is not a limitation, and it is possible to adopt polyimide resin or the like. Further, as the binder resin, it is possible to adopt thermoplastic resin instead of the thermosetting resin.

Further, by separating the resin film 107, the laminated body 71 with an even number of layers in the reverse layer is formed.

Unlike the laminated body 70 with an odd number of layers in the reverse layer, the laminated body 71 with an even number of layers in the reverse layer includes the metal layer 90 and the metal layer 102 as the two layers which are patterned inside the laminated body, and the metal layer 90 and the metal layer 102 are electrically coupled with the plated vias 78.

Features of Manufacturing Method of Present Embodiment

In the method for manufacturing the multilayer substrate in the present embodiment, an operation of simultaneously manufacturing the two laminated bodies (a plurality of metal layers is electrically coupled with plated vias) from the support body is included, and by laminating a plurality of the laminated bodies thus manufactured with paste vias, it is possible to manufacture the multilayer substrate in which the plated vias and the paste vias are mixed. Therefore, it is possible to decrease the interlayer resistance value compared to the interlayer coupling only with the paste vias to thereby increase the allowable current value, and it is possible to achieve shortening of the manufacturing process.

Further, in the present embodiment, when laminating the plurality of laminated bodies, the three types of laminated bodies (regarding the laminated body in the reverse layer, in addition, there are two types, the odd number of layers and the even number of layers) different in configuration from each other, namely the obverse layer, the intermediate layer, and the reverse layer, are laminated to form the completed laminated body.

Regarding the laminated body in the obverse layer, when being laminated as the completed laminated body, the metal layer exposed on the obverse surface is not formed, and the plated via which couples the metal layer exposed on the obverse surface and the metal layer located inside is not formed. Further, regarding also the laminated body in the reverse layer, when being laminated as the completed laminated body, the metal layer exposed on the reverse surface is not formed, and the plated via which couples the metal layer exposed on the reverse surface and the metal layer located inside is not formed. After being laminated as the completed laminated body, the metal layers exposed on the obverse surface and the reverse, and the plated vias which couple these metal layers and the metal layers located inside are formed.

Therefore, it is possible to uniform pressure dispersion when performing the thermocompression bonding when laminating the plurality of laminated bodies, and it is possible to prevent an occurrence of a distortion of the completed laminated body and so on.

Other Embodiments

It should be noted that it is possible to form thermal vias in each of the laminated bodies 60, 70, and 71 constituting the completed laminated body.

Figure 47:
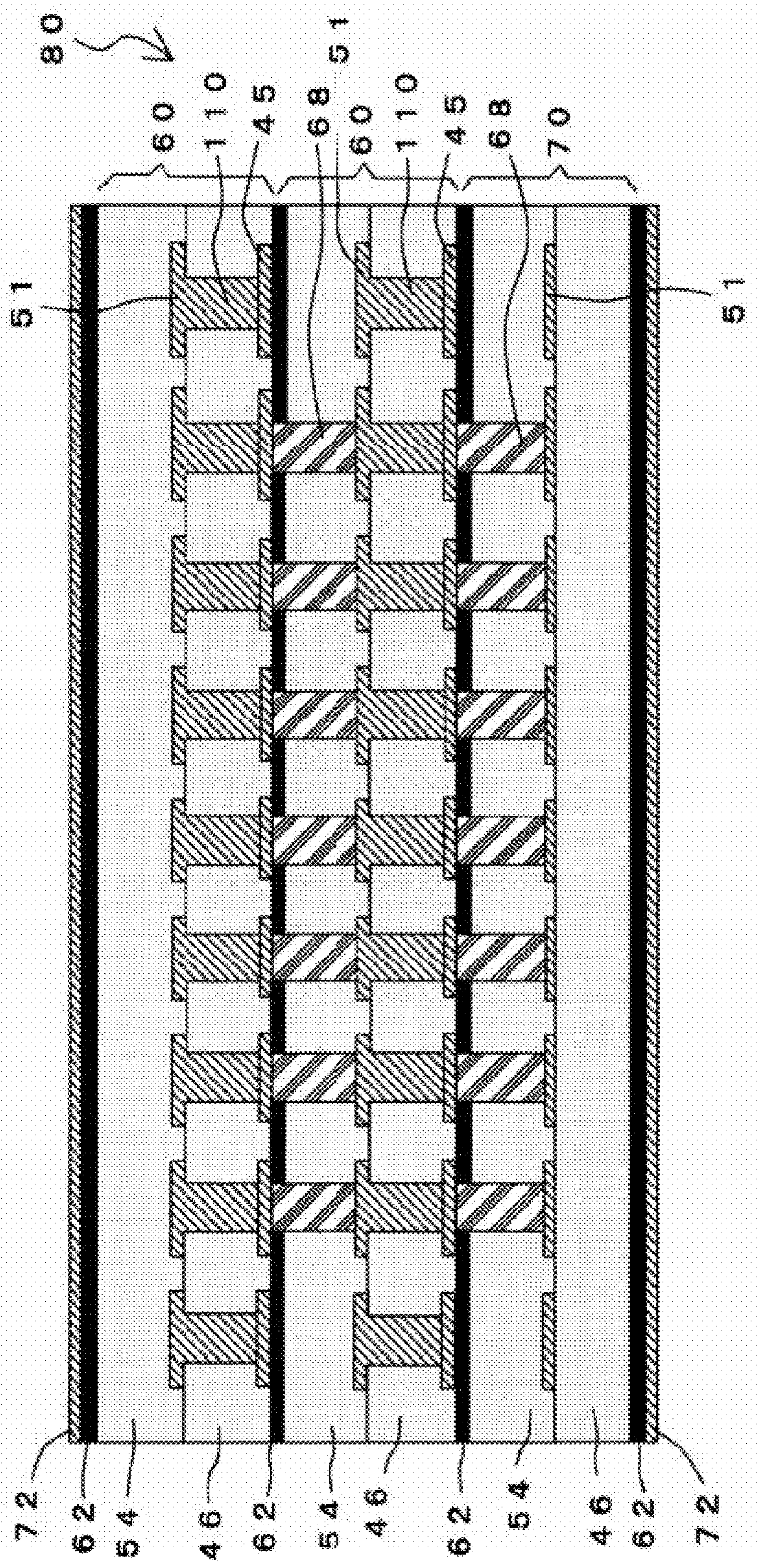
FIG. 47 is a schematic cross-sectional view showing another embodiment of the multilayer substrate.

An embodiment of the completed laminated body 80 in which the thermal vias are formed is shown in FIG. 47.

In the completed laminated body 80 shown in FIG. 47, places where the paste vias to be coupled to the metal layer 51 are not formed are disposed in the laminated body 60 in the obverse layer, the laminated body 60 in the intermediate layer, and the laminated body 70 in the reverse layer. The places where the paste vias are not formed turn to thermal vias 110.

Therefore, in the laminated body 60 in the obverse layer and the laminated body 60 in the intermediate layer, the plated vias 52 which couples the metal layer 45 and the metal layer 51 located inside turn to the thermal vias 110 in the state of being embedded in the insulating layer 46. Further, here, the laminated body 70 in the reverse layer consists of an odd number of layers, and by disposing the places where the paste vias to be coupled to the metal layer 51 are not formed, the metal layer 51 of the laminated body 70 in the reverse layer comes into the state of being embedded in the insulating layer 54.

It should be noted that the multilayer substrate to be manufactured by the method for manufacturing the multilayer substrate described above can be used also as a motherboard (a support substrate), and can be used also as an interposer (a relay substrate). It can be used in particular as the motherboard or the interposer of a server system or a high-speed communication system, and can further be used as a multilayer substrate constituting a semiconductor element. Further, it can also be applied to an inspection device, a probe card, and so on to be used for a quality determination of a semiconductor.

Electronic Device

The electronic device has electronic components arranged on the multilayer substrate described above, and further has other members as needed.

As the electronic device, there can be cited, for example, a smartphone, a tablet mobile terminal, and a computer.

What is claimed is:

1. A multilayer substrate including a plurality of insulating layers, and a plurality of metal layers which are formed on both surfaces of each of the insulating layers, and which are patterned, wherein interlayer coupling between the metal layers is achieved with a via, the multilayer substrate being characterized by including: a layer interlayer-coupled with a plated via; a layer interlayer-coupled with a paste via filled with a conductive paste; and a plurality of plated-via laminated bodies having insulating layers, the metal layers of which are interlayer-coupled with the plated via is provided, and the plurality of plated-via laminated bodies is laminated by being electrically coupled with the paste via filled with the conductive paste, wherein the plated via and the paste via overlap each other in a vertical direction, and wherein the plated via and the paste via are electrically connected to each other.

2. The multilayer substrate according to claim 1 characterized in that the paste via filled with the conductive paste is not formed in a row in a lamination direction.

3. The multilayer substrate according to claim 1 characterized in that an insulating bonding layer is disposed between two insulating layers having contact with a first metal layer electrically coupled with the paste via, and two insulating layers having contact with a second metal layer electrically coupled with the plated via are directly laminated without an insulating bonding layer disposed between the two insulating layers.

4. The multilayer substrate according to claim 1 characterized in that in some of places where the interlayer-coupling with the plated via is performed in the plated-via laminated body, the metal layers opposed to each other of the plurality of plated-via laminated bodies are not electrically coupled to each other with the paste via, and are configured as a thermal via.

5. A method for manufacturing a multilayer substrate characterized by including: a step of manufacturing a plated-via laminated body having a plurality of insulating layers, and a plurality of metal layers which are formed on surfaces of the plurality of insulating layers, and which are patterned, and configured by interlayer-coupling the metal layers with a plated via; and a step of electrically coupling the metal layers opposed to each other of a plurality of the plated-via laminated bodies with a paste via filled with a conductive paste to laminate the plurality of the plated-via laminated bodies, wherein the plated via and the paste via overlap each other in a vertical direction, and wherein the plated via and the paste via are electrically connected to each other.

6. The method for manufacturing the multilayer substrate according to claim 5 characterized in that a metal layer which is patterned is not formed on an obverse surface of the plated-via laminated body in an obverse layer located at an obverse surface side of the multilayer substrate and on a reverse surface of the plated-via laminated body in a reverse layer located at a reverse surface side of the multilayer substrate before laminating the plurality of the plated-via laminated bodies, and after laminating the plurality of the plated-via laminated bodies, a step of forming an obverse surface through hole in an insulating layer in an uppermost part of the plated-via laminated body in the obverse layer up to an obverse surface of the metal layer located on a lower surface of the insulating layer in the uppermost part, a step of forming a reverse surface through hole in an insulating layer in a lowermost part of the plated-via laminated body in the reverse layer up to a reverse surface of the metal layer located on an upper surface of the insulating layer in the lowermost part, a step of forming an obverse surface plating pattern on an obverse surface of the insulating layer in the uppermost part including an inside of the obverse surface through hole to thereby couple the obverse surface plating pattern and the metal layer located on the lower surface of the insulating layer in the uppermost part with a plated via obtained by plating the obverse surface through hole, and a step of forming a reverse surface plating pattern on a reverse surface of the insulating layer in the lowermost part including an inside of the reverse surface through hole to thereby couple the reverse surface plating pattern and the metal layer located on the upper surface of the insulating layer in the lowermost part with a plated via obtained by plating the reverse surface through hole are executed.

7. The method for manufacturing the multilayer substrate according to claim 5 characterized in that when laminating the plurality of the plated-via laminated bodies, as the laminated body located at a reverse surface side of the multilayer substrate, a laminated body in which a single metal layer is formed between two insulating layers, and no plated via is formed is used.

8. The method for manufacturing the multilayer substrate according to claim 5 characterized in that the step of manufacturing the plated-via laminated body includes a step of bonding a metal laminated body formed of three metal layers, a base member shaped like a plate, and a bonding layer disposed between the metal laminated body and the base member with thermocompression bonding to form a support body, a step of separating a first metal layer as an uppermost surface of the metal laminated body, a step of forming a first plating pattern on an obverse surface of a second metal layer which becomes the uppermost surface subsequently to the metal layer separated in the metal laminated body, a step of forming a first insulating layer formed of insulating resin on the obverse surface of the second metal layer on which the first plating pattern is formed, a step of forming a first through hole penetrating the first insulating layer up to an obverse surface of the first plating pattern, a step of forming a second plating pattern on an obverse surface of the first insulating layer including an inside of the first through hole to thereby couple the first plating pattern and the second plating pattern with a plated via obtained by plating the first through hole, a step of forming a second insulating layer formed of insulating resin on the obverse surface of the first insulating layer on which the second plating pattern is formed, and a step of separating a third metal layer and the second metal layer out of the base member, the bonding layer and the metal laminated body, and the step of interlayer-coupling the plurality of the plated-via laminated bodies with the conductive paste includes a step of forming a second through hole penetrating the second insulating layer up to an obverse surface of the second plating pattern in any of the plurality of the plated-via laminated bodies, a step of filling the second through hole with a conductive paste, and a step of performing lamination so that the conductive paste in the plated-via laminated body filled with the conductive paste makes contact with the first plating pattern of another plated-via laminated body.

9. The method for manufacturing the multilayer substrate according to claim 8 characterized in that the support body is configured by sandwiching a metal layer smaller in width than the bonding layer between the metal laminated body formed of the three metal layers and the bonding layer.

10. The method for manufacturing the multilayer substrate according to claim 8 characterized in that in the support body, the metal laminated body formed of the three metal layers, and the bonding layer disposed between the metal laminated body and the base member are disposed at both surface sides of the base member, and two plated-via laminated bodies are simultaneously formed after separating the third metal layer and the second metal layer out of the base member, the bonding layer and the metal laminated body.

11. An electronic device comprising: the multilayer substrate according to claim 1; and an electronic component mounted on the multilayer substrate.

* * * * *